(12) United States Patent
Liao et al.

(10) Patent No.: US 10,770,414 B2
(45) Date of Patent: Sep. 8, 2020

(54) SEMICONDUCTOR STRUCTURE HAVING MULTIPLE DIELECTRIC WAVEGUIDE CHANNELS AND METHOD FOR FORMING SEMICONDUCTOR STRUCTURE

(71) Applicant: TAIWAN SEMICONDUCTOR MANUFACTURING COMPANY LTD., Hsinchu (TW)

(72) Inventors: Wen-Shiang Liao, Miaoli County (TW); Huan-Neng Chen, Taichung (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/017,562

(22) Filed: Jun. 25, 2018

(65) Prior Publication Data

US 2019/0393171 A1    Dec. 26, 2019

(51) Int. Cl.
*G02B 6/132* (2006.01)
*G02B 6/122* (2006.01)
(Continued)

(52) U.S. Cl.
CPC .......... *H01L 23/66* (2013.01); *H01L 21/4853* (2013.01); *H01L 21/4857* (2013.01); *H01L 21/565* (2013.01); *H01L 21/568* (2013.01); *H01L 21/6835* (2013.01); *H01L 21/76802* (2013.01); *H01L 21/76877* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 25/18* (2013.01); *H01L 25/50* (2013.01); *H01P 3/16* (2013.01);
(Continued)

(58) Field of Classification Search
None
See application file for complete search history.

(56) References Cited

U.S. PATENT DOCUMENTS 9,715,131 B2    7/2017  Jou et al.
2016/0147088 A1*  5/2016  Jou ........................ G02F 1/025
                                                 385/2
2017/0294697 A1   10/2017  Jou et al.

* cited by examiner

*Primary Examiner* — Joseph C. Nicely
*Assistant Examiner* — Lamont B Koo
(74) *Attorney, Agent, or Firm* — WPAT, P.C., Intellectual Property Attorneys; Anthony King

(57) ABSTRACT

A semiconductor structure includes a first dielectric waveguide, a second dielectric waveguide, a first inter-level dielectric (ILD) material, a first transmitter coupling structure and a second transmitter coupling structure. The first and second dielectric waveguides are disposed one over the other. The first dielectric waveguide is configured to guide a first electromagnetic signal. The second dielectric waveguide is configured to guide a second electromagnetic signal. The first and second electromagnetic signals have different frequencies. The first ILD material is disposed between the first and second dielectric waveguides. The first transmitter coupling structure is configured to couple a first driver signal generated by a transmitter die to the first dielectric waveguide, and accordingly produce the first electromagnetic signal. The second transmitter coupling structure is configured to couple a second driver signal generated by the transmitter die to the second dielectric waveguide, and accordingly produce the second electromagnetic signal.

20 Claims, 26 Drawing Sheets

(51) Int. Cl.
*H01L 23/66* (2006.01)
*H01P 5/08* (2006.01)
*H01L 21/768* (2006.01)
*H01P 11/00* (2006.01)
*H01L 23/00* (2006.01)
*H01L 21/48* (2006.01)
*H01L 23/538* (2006.01)
*H01L 21/683* (2006.01)
*H01L 21/56* (2006.01)
*H01L 23/31* (2006.01)
*H01L 25/00* (2006.01)
*H01L 25/18* (2006.01)
*H01P 3/16* (2006.01)

(52) U.S. Cl.
CPC ............ *H01P 5/087* (2013.01); *H01P 11/006* (2013.01); *H01L 2221/68359* (2013.01); *H01L 2223/6616* (2013.01); *H01L 2223/6633* (2013.01); *H01L 2224/211* (2013.01); *H01L 2924/19032* (2013.01); *H01L 2924/19039* (2013.01)

SEMICONDUCTOR STRUCTURE HAVING MULTIPLE DIELECTRIC WAVEGUIDE CHANNELS AND METHOD FOR FORMING SEMICONDUCTOR STRUCTURE

BACKGROUND

The present disclosure relates to dielectric waveguides and, more particularly, to a semiconductor structure having multiple dielectric waveguide channels disposed one above another in different layers, and a method for forming the semiconductor structure.

Integrated optical waveguides are often used as components in integrated optical circuits having multiple photonic functions. Integrated optical waveguides are used to confine and guide light from a first point on an integrated chip (IC) to a second point on the IC with minimal attenuation. Generally, integrated optical waveguides provide functionality for signals imposed on optical wavelengths in the visible spectrum.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
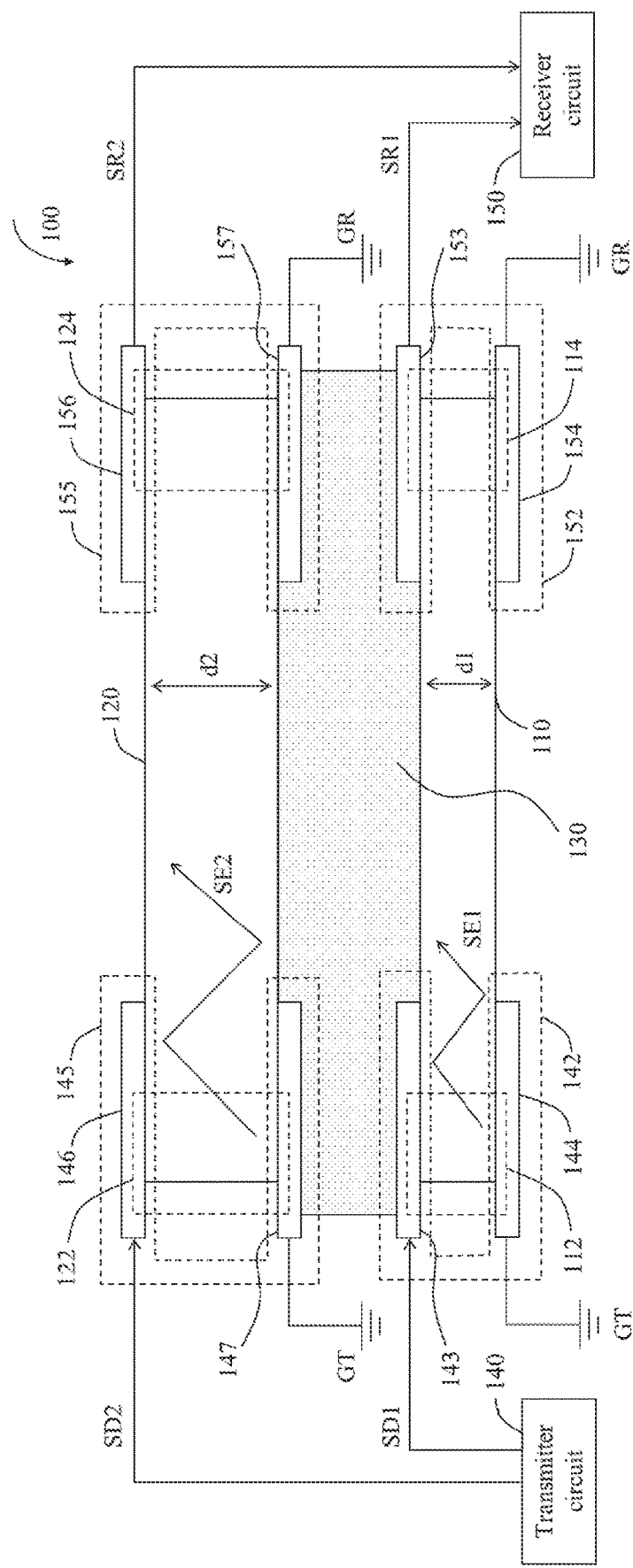
FIG. 1A is a schematic diagram illustrating an exemplary semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure describes exemplary semiconductor structures which can be employed in various semiconductor packages such as three-dimensional (3D) integrated circuit (IC) packages or Integrated Fan-Out (InFO) packages. The exemplary semiconductor structure includes multiple dielectric waveguide channels disposed one above another in different layers to propagate signals at different frequencies and/or provide high data transmission rates. The present disclosure further describes exemplary methods for forming the exemplary semiconductor structures. In some embodiments, at least one of multiple dielectric waveguide channels of an exemplary semiconductor structure may be a dielectric waveguide having a substantially rectangular cross-section. In some embodiments, at least one of multiple dielectric waveguide channels of an exemplary semiconductor structure may be a dielectric slab waveguide.

FIG. 1A is a schematic diagram illustrating an exemplary semiconductor structure 100 according to an embodiment of the present disclosure. Referring to FIG. 1A, the semiconductor structure 100 includes a first dielectric waveguide 110, a second dielectric waveguide 120, an inter-level dielectric (ILD) material 130, a transmitter circuit 140, a first transmitter coupling structure 142, a second transmitter coupling structure 145, a receiver circuit 150, a first receiver coupling structure 152 and a second receiver coupling structure 155. The first dielectric waveguide 110 and the second dielectric waveguide 120 are disposed one over the other, and configured to propagate signals. In some embodiments, the first dielectric waveguide 110 is configured to guide an electromagnetic signal SE1 from a transmission end portion 112 to a receiver end portion 114 of the first dielectric waveguide 110. Similarly, the second dielectric waveguide 120 is configured to guide an electromagnetic signal SE2 from a transmission end portion 122 to a receiver end portion 124 of the second dielectric waveguide 120. In some embodiments, at least one of the electromagnetic signals SE1 and SE2 respectively propagated by the first dielectric waveguide 110 and the second dielectric waveguide 120 is a single ended signal. In some embodiments, at least one of the electromagnetic signals SE1 and SE2 respectively propagated by the first dielectric waveguide 110 and the second dielectric waveguide 120 is a differential signal.

In some embodiments, the electromagnetic signal SE1 propagated by the first dielectric waveguide 110 is different in frequency from the electromagnetic signal SE2 propagated by the second dielectric waveguide 120. For example, the semiconductor structure 100 is employed in 5G millimeter-wave (mm-wave) transmission. In that case, the first dielectric waveguide 110 located below the second dielectric waveguide 120 can be configured to transmit the electromagnetic signal SE1 having a frequency (e.g. over 10 GHz) greater than that of the electromagnetic signal SE2 (e.g. about 5 GHz). Those skilled in the relevant art will recognize that the first dielectric waveguide 110 located below the second dielectric waveguide 120 can be configured to transmit the electromagnetic signal SE1 having a frequency lower than or equal to that of the electromagnetic signal SE2 in the 5G mm-wave transmission without departing from the spirit and scope of the present disclosure.

By way of example but not limitation, a dielectric constant of the first dielectric waveguide 110 is different from (i.e. greater than or smaller than) a dielectric constant of the second dielectric waveguide 120. In addition, a thickness d1 of the first dielectric waveguide 110 is different from (i.e. greater than or smaller than) a thickness d2 of the second dielectric waveguide 120. As a result, the first dielectric waveguide 110 and the second dielectric waveguide 120 can be configured to propagate the electromagnetic signals SE1 and SE2 at different frequencies.

The ILD material 130 is disposed between the first dielectric waveguide 110 and the second dielectric waveguide 120, such that the first dielectric waveguide 110 and the second dielectric waveguide 120 are spatially separated from each other. In the embodiment shown in FIG. 1, the second dielectric waveguide 120 is disposed over the ILD material 130, and the ILD material 130 is disposed over the first dielectric waveguide 110. In some embodiments, a dielectric constant of the ILD material 130 is smaller than a dielectric constant of the first dielectric waveguide 110 and a dielectric constant of the second dielectric waveguide 120. In some examples, the ILD material 130 may include relatively low dielectric constant material(s) such as fluorine-doped silicon dioxide ($SiO_2$), carbon-doped silicon dioxide, porous silicon dioxide, or a similar material. In some examples, the ILD material 130 may include polymer layer(s) formed of polyimide (PI), polybenzoxazole (PBO), benzocyclobutene (BCB), epoxy, silicone, acrylates, nano-filled phenol resin, siloxane, a fluorinated polymer, polynor-bornene, or the like, but the present disclosure is not limited thereto.

The transmitter circuit 140 is configured to generate a driver signal SD1, carrying first data to be transmitted, and send the same to the first transmitter coupling structure 142 of the first dielectric waveguide 110. Also, the transmitter circuit 140 is configured to generate a driver signal SD2, carrying second data to be transmitted, and send the same to the second transmitter coupling structure 145 of the second dielectric waveguide 120. The receiver circuit 150 is configured to receive a receiver signal SR1 including the data carried by the driver signal SD1 from the first receiver coupling structure 152 of the first dielectric waveguide 110, and receive a receiver signal SR2 including the data carried by the driver signal SD2 from the second receiver coupling structure 155 of the second dielectric waveguide 120. As a result, the first dielectric waveguide 110 and the second dielectric waveguide 120 can be used as multiple channels for transmitting data provided by the transmitter circuit 140.

The first transmitter coupling structure 142 is configured to couple the driver signal SD1 from the transmitter circuit 140 to the transmission end portion 112, and accordingly produce the electromagnetic signal SE1. In the present embodiment, when the driver signal SD1 is coupled to the transmission end portion 112, an electric field is induced in the transmission end portion 112. The induced electric field causes electromagnetic radiation corresponding to the driver signal SD1 to be coupled into the first dielectric waveguide 110, thereby producing the electromagnetic signal SE1.

The first receiver coupling structure 152, coupled between the receiver end portion 114 and the receiver circuit 150, is configured to couple the electromagnetic signal SE1 to produce the receiver signal SR1 including the first data carried by the driver signal SD1. For example, the first transmitter coupling structure 142 is configured to couple the driver signal SD1 into the first dielectric waveguide 110 from the transmission end portion 112 as electromagnetic radiation, or the electromagnetic signal SE1. The first receiver coupling structure 152 is configured to couple the electromagnetic radiation, or the electromagnetic signal SE1, out of the first dielectric waveguide 110 as the receiver signal SR1.

Similarly, in the present embodiment, the second transmitter coupling structure 145 is configured to couple the driver signal SD2 from the transmitter circuit 140 to the transmission end portion 122, and accordingly produce the electromagnetic signal SE2. The second receiver coupling structure 155 is coupled between the receiver end portion 124 and the receiver circuit 150, and is configured to couple the electromagnetic signal SE2 to produce the receiver signal SR2 including the data carried by the driver signal SD2. For example, the second transmitter coupling structure 145 is configured to couple the driver signal SD2 into the second dielectric waveguide 120 from the transmission end portion 122 as electromagnetic radiation, or the electromagnetic signal SE2. The second receiver coupling structure 155 is configured to couple the electromagnetic radiation, or the electromagnetic signal SE2, out of the second dielectric waveguide 120 as the receiver signal SR2.

Figure 1B:
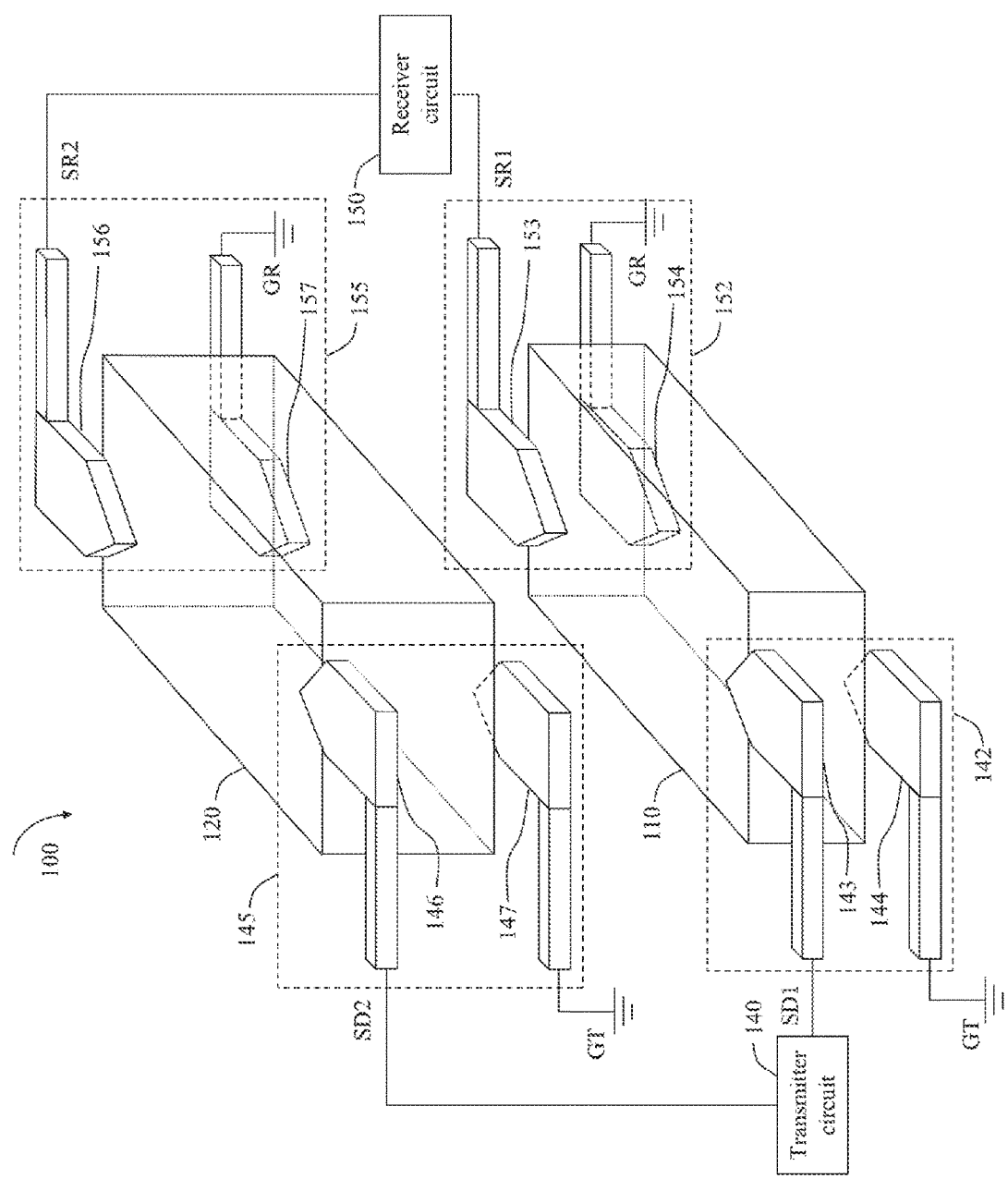
FIG. 1B, which illustrates a 3D view of the semiconductor structure shown in FIG. 1A in accordance with some embodiments of the present disclosure.

In some embodiments, at least one of the first transmitter coupling structure 142 and the second transmitter coupling structure 145 may include a pair of metal structures. Moreover, at least one of the first receiver coupling structure 152 or the second receiver coupling structure 155 may include a pair of metal structures. Refer to FIG. 1B, which illustrates a 3D view of the semiconductor structure 100 shown in FIG. 1A according to an embodiment of the present disclosure. In the embodiment shown in FIG. 1B, each of the first dielectric waveguide 110 and the second dielectric waveguide 120 has a rectangular cross-section. For example, at least one of the first dielectric waveguide 110 and the second dielectric waveguide 120 can be a dielectric slab waveguide.

The first transmitter coupling structure 142 may include a pair of transmitter electrodes 143 and 144. The transmitter electrode 143 includes a metal structure, which may further include microstrips, disposed over the first dielectric waveguide 110. In addition, the metal structure is configured to couple the driver signal SD1 to the first dielectric waveguide 110 at the transmission end portion 112 shown in FIG. 1A. The transmitter electrode 144 includes a metal structure, which may further include microstrips, disposed below the first dielectric waveguide 110. In addition, this metal structure is coupled between the first dielectric waveguide 110 at the transmission end portion 112 shown in FIG. 1A and a transmitter ground GT (e.g. a ground terminal). In some embodiments, the transmitter electrode 143 and the transmitter electrode 144 are located on opposite sides of the first dielectric waveguide 110. In some embodiments, the transmitter electrode 143 and the transmitter electrode 144 are symmetrically disposed with respect to the first dielectric waveguide 110. In some embodiments, the shapes and/or patterns of the transmitter electrode 143 and the transmitter electrode 144 are identical with each other.

The first receiver coupling structure 152 may include a pair of receiver electrodes 153 and 154. The receiver electrode 153 includes a metal structure, which may include microstrips, disposed over the first dielectric waveguide 110. The metal structure is configured to couple the first dielectric waveguide 110, or the receiver end portion 114 shown in FIG. 1A, to the receiver circuit 150. The receiver electrode 154 includes a metal structure, which may include microstrips, disposed below the first dielectric waveguide 110. The metal structure is coupled between the first dielectric waveguide 110 and a receiver ground RT, such as a ground terminal. In the present embodiment, the receiver electrode 153 and the receiver electrode 154 are located on opposite sides of the first dielectric waveguide 110. In some embodiments, the receiver electrode 153 and the receiver electrode 154 are symmetrically disposed with respect to the first dielectric waveguide 110. In some embodiments, the shapes and/or patterns of the receiver electrode 153 and the receiver electrode 154 are identical with each other.

In the present embodiment, the transmitter electrode 143 and the receiver electrode 153 are disposed within a metal layer over the first dielectric waveguide 110. In addition, the transmitter electrode 144 and the receiver electrode 154 are disposed within a metal layer below the first dielectric waveguide 110.

Similarly, in the embodiment shown in FIG. 1B, the second transmitter coupling structure 145 may include a pair of transmitter electrodes 143 and 144. The transmitter electrode 146 includes a metal structure, which may include microstrips, disposed over the second dielectric waveguide 120. The metal structure is configured to couple the driver signal SD1 to the second dielectric waveguide 120, or the transmission end portion 122 shown in FIG. 1A. The transmitter electrode 147 includes a metal structure, which may include microstrips, disposed below the second dielectric waveguide 120. The metal structure is coupled between the second dielectric waveguide 120 and the transmitter ground GT. In the present embodiment, the transmitter electrode 146 and the transmitter electrode 147 are located on opposite sides of the second dielectric waveguide 120. In some embodiments, the transmitter electrode 146 and the transmitter electrode 147 are symmetrically disposed with respect to the first dielectric waveguide 110. In some embodiments, the shapes and/or patterns of the transmitter electrode 146 and the transmitter electrode 147 are identical with each other.

The second receiver coupling structure 155 may include a pair of receiver electrodes 156 and 157. The receiver electrode 156 includes a metal structure, which may include microstrips, disposed over the second dielectric waveguide 120. The metal structure is configured to couple the second dielectric waveguide 120, or the receiver end portion 124 shown in FIG. 1A, to the receiver circuit 150. The receiver electrode 157 includes a metal structure, which may include microstrips, disposed below the second dielectric waveguide 120. The metal structure is coupled between the second dielectric waveguide 120 and the receiver ground RT. In the present embodiment, the receiver electrode 156 and the receiver electrode 157 are located on opposite sides of the first dielectric waveguide 110. In some embodiments, the receiver electrode 156 and the receiver electrode 157 are symmetrically disposed with respect to the second dielectric waveguide 120. In some embodiments, the shapes and/or patterns of the receiver electrode 156 and the receiver electrode 157 are identical with each other.

In the present embodiment, the transmitter electrode 146 and the receiver electrode 156 are disposed within a metal layer over the second dielectric waveguide 120. In addition, the transmitter electrode 147 and the receiver electrode 157 are disposed within a metal layer below the second dielectric waveguide 120.

With multiple dielectric waveguide channels, each being coupled between the transmitter circuit 140 and the receiver circuit 150 though a corresponding transmitter coupling structure and a corresponding receiver coupling structure, the semiconductor structure 100 can provide high speed data transmission because of wide bandwidth of electromagnetic radiation that can be transmitted in each dielectric waveguide channel. For example, at least one of the first dielectric waveguide 110 and the second dielectric waveguide 120 can transmit electromagnetic radiation having a bandwidth ten times wider than that of the visible spectrum. As a result, the semiconductor structure 100 is suitable for 5G communication, high performance computing (HPC) applications, artificial intelligence (AI) and neuroengineering (or neural engineering). In addition, the semiconductor structure 100 can provide different data communication applications when different dielectric waveguide channels are configured to transmit electromagnetic radiation in different frequency bands. In some examples, a waveguide channel having a higher dielectric constant can be used for lower frequency transmission because its thickness and size can be smaller, thus saving manufacturing costs.

Figure 2:
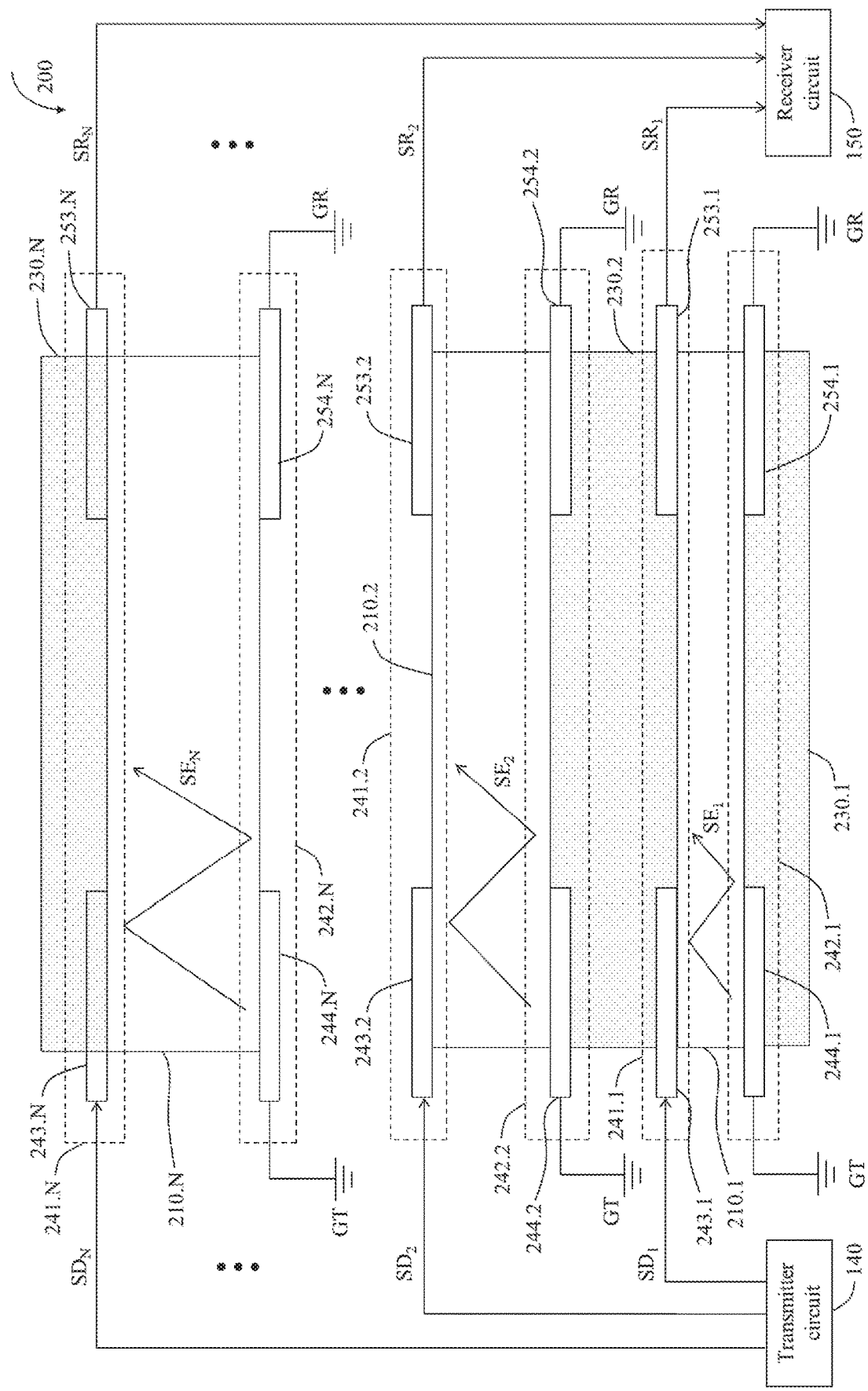
FIG. 2 is a schematic diagram illustrating an exemplary semiconductor structure in accordance with some embodiments of the present disclosure.

Please note that the number of dielectric waveguide channels shown in FIG. 1A or FIG. 1B is for illustrative purposes only, and is not intended to limit the scope of the present disclosure. Refer to FIG. 2, which is a schematic diagram illustrating an exemplary semiconductor structure according to an embodiment of the present disclosure. In the embodiment shown in FIG. 2, the semiconductor structure 200 includes N dielectric waveguides 210.1-210.N, N first metal layers 241.1-241.N and N second metal layers 242.1-242.N, wherein N is an integer greater than one. The N dielectric waveguides 210.1-210.N are disposed one above another and spatially separated from each other. By way of example but not limitation, the semiconductor structure 200 can further include a plurality of ILD layers 230.1-230.M interleaved with the N dielectric waveguides 210.1-210.N, wherein M is an integer greater than one. In some embodiments, each dielectric waveguide is disposed between two ILD layers such that M is equal to N+1. In some embodiments, there may be more than one ILD layer disposed between two consecutive dielectric waveguides.

In some embodiments, an electromagnetic signal guided by a first dielectric waveguide of the N dielectric waveguides 210.1-210.N, i.e. one of electromagnetic signals $SE_1$-$SE_N$, can be different in frequency from an electromagnetic signal guided by a second dielectric waveguide of the N dielectric waveguides 210.1-210.N, i.e. another of the electromagnetic signals $SE_1$-$SE_N$. By way of example but not limitation, a dielectric constant of one dielectric waveguide is different from a dielectric constant of another dielectric waveguide, and/or a thickness of the one dielectric waveguide is different from a thickness of the other dielectric waveguide. As a result, the electromagnetic signal guided by the first dielectric waveguide and the electromagnetic signal guided by the second dielectric waveguide can have different frequencies.

In the embodiment shown in FIG. 2, an ILD layer of the ILD layers 230.1-230.M, a dielectric waveguide disposed over the ILD layer, and a dielectric waveguide disposed below the ILD layer can respectively represent exemplary embodiments of the ILD material 130, the first dielectric waveguide 110 and the second dielectric waveguide 120 as described above in FIG. 1A and FIG. 1B. As such, each of the N dielectric waveguides 210.1-210.N can be configured to transmit data carried in a driver signal, i.e. one of the driver signals $SD_1$-$SD_N$, generated by the transmitter circuit 140 to the receiver circuit 150 through corresponding transmitter and receiver coupling structures disposed within in metal layers, allowing a receiver signal, i.e. one of the receiver signals SR$_1$-SR$_N$, carrying the transmitted data to be provided for the receiver circuit 150.

In some embodiments, a dielectric constant of each dielectric waveguide is greater than a dielectric constant of an ILD layer located on the first side of the dielectric waveguide and a dielectric constant of an ILD layer located on the second side of the dielectric waveguide. For example, a dielectric constant of the dielectric waveguide 210.1 is greater than a dielectric constant of the ILD layer 241.1 and a dielectric constant of the ILD layer 242.1. Hence, electromagnetic radiation introduced into the dielectric waveguide 210.1 can be effectively confined within the dielectric waveguide 210.1 by total internal reflection, and guided from a transmission end portion to a receiver end portion of the dielectric waveguide 210.

In the embodiment shown in FIG. 2, each of the N dielectric waveguides 210.1-210.N has a rectangular cross-section, a first side and a second side opposite to the first side. The first side and the second side may be an upper side and a lower side respectively. The N first metal layers 241.1-241.N are disposed along respective first sides of the N dielectric waveguides 210.1-210.N, respectively, and the N second metal layers 242.1-242.N disposed along respective second sides of the N dielectric waveguides 210.1-210.N, respectively. Each of the N first metal layers 241.1-241.N may include a first transmitter electrode, i.e. one of transmitter electrodes 243.1-243.N, and a first receiver electrode, i.e. one of receiver electrodes 253.1-253.N, separated from each other. The first transmitter electrode is coupled to the transmitter circuit 140, and the first receiver electrode is coupled to the receiver circuit 150. Each of the N second metal layers 242.1-242.N may include a second transmitter electrode, i.e. one of transmitter electrodes 244.1-244.N, and a second receiver electrode, i.e. one of receiver electrodes 254.1-254.N, separated from each other, the second transmitter electrode is coupled to a transmitter ground, and the second receiver electrode is coupled to a receiver ground.

In some embodiments, one of the N first metal layers 241.1-241.N can represent an exemplary embodiment of the metal layer within which the transmitter electrode 143 and the receiver electrode 153 as described above in FIG. 1A and FIG. 1B are disposed, and one of the N second metal layers 242.1-242.N can represent an exemplary embodiment of the metal layer within which the transmitter electrode 144 and the receiver electrode 154 as described above in FIG. 1A and FIG. 1B are disposed. As such, the first transmitter electrode and the first receiver electrode disposed along the first side of one of the N dielectric waveguides 210.1-210.N can represent exemplary embodiments of the transmitter electrode 143 and the receiver electrode 153 as described above in FIG. 1A and FIG. 1B, and the second transmitter electrode and the second receiver electrode disposed along the second side of one of the N dielectric waveguides 210.1-210.N can represent exemplary embodiments of the transmitter electrode 144 and the receiver electrode 154 as described above in FIG. 1A and FIG. 1B.

In some embodiments, one of the N first metal layers 241.1-241.N can represent an exemplary embodiment of the metal layer within which the transmitter electrode 146 and the receiver electrode 156 as described above in FIG. 1A and FIG. 1B are disposed, and one of the N second metal layers 242.1-242.N can represent an exemplary embodiment of the metal layer within which the transmitter electrode 147 and the receiver electrode 157 as described above in FIG. 1A and FIG. 1B are disposed. As such, the first transmitter electrode and the first receiver electrode disposed along the first side of one of the N dielectric waveguides 210.1-210.N can represent exemplary embodiments of the transmitter electrode 146 and the receiver electrode 156 as described above in FIG. 1A and FIG. 1B, and the second transmitter electrode and the second receiver electrode disposed along the second side of one of the N dielectric waveguides 210.1-210.N can represent exemplary embodiments of the transmitter electrode 147 and the receiver electrode 157 as described above in FIG. 1A and FIG. 1B.

In some embodiments, a molding compound (not shown in FIG. 2) can be disposed below the N dielectric waveguides 210.1-210.N, and arranged to surround the transmitter circuit 140 and the receiver circuit 150. As such, the N dielectric waveguides 210.1-210.N, the transmitter circuit 140 and the receiver circuit 150 can be formed within a semiconductor package.

FIGS. 3-24 illustrate cross-sectional views of an exemplary Integrated Fan-Out (InFO) package 300, including the semiconductor structure 100 as illustrated in FIG. 1A, at different stages of a manufacturing process according to an embodiment of the present disclosure. In some embodiments, the description that follows can also be used to fabricate an InFO package including a semiconductor structure having more than two dielectric waveguide channels, such as the semiconductor structure 200 as described above in FIG. 2. In some embodiments, the description that follows can also be used to fabricate other types of 3D IC packages including the semiconductor structure 100 as described above in FIG. 1A, or a 3D IC package including a semiconductor structure having more than two dielectric waveguide channels, such as the semiconductor structure 200 as described above in FIG. 2.

Figure 3:
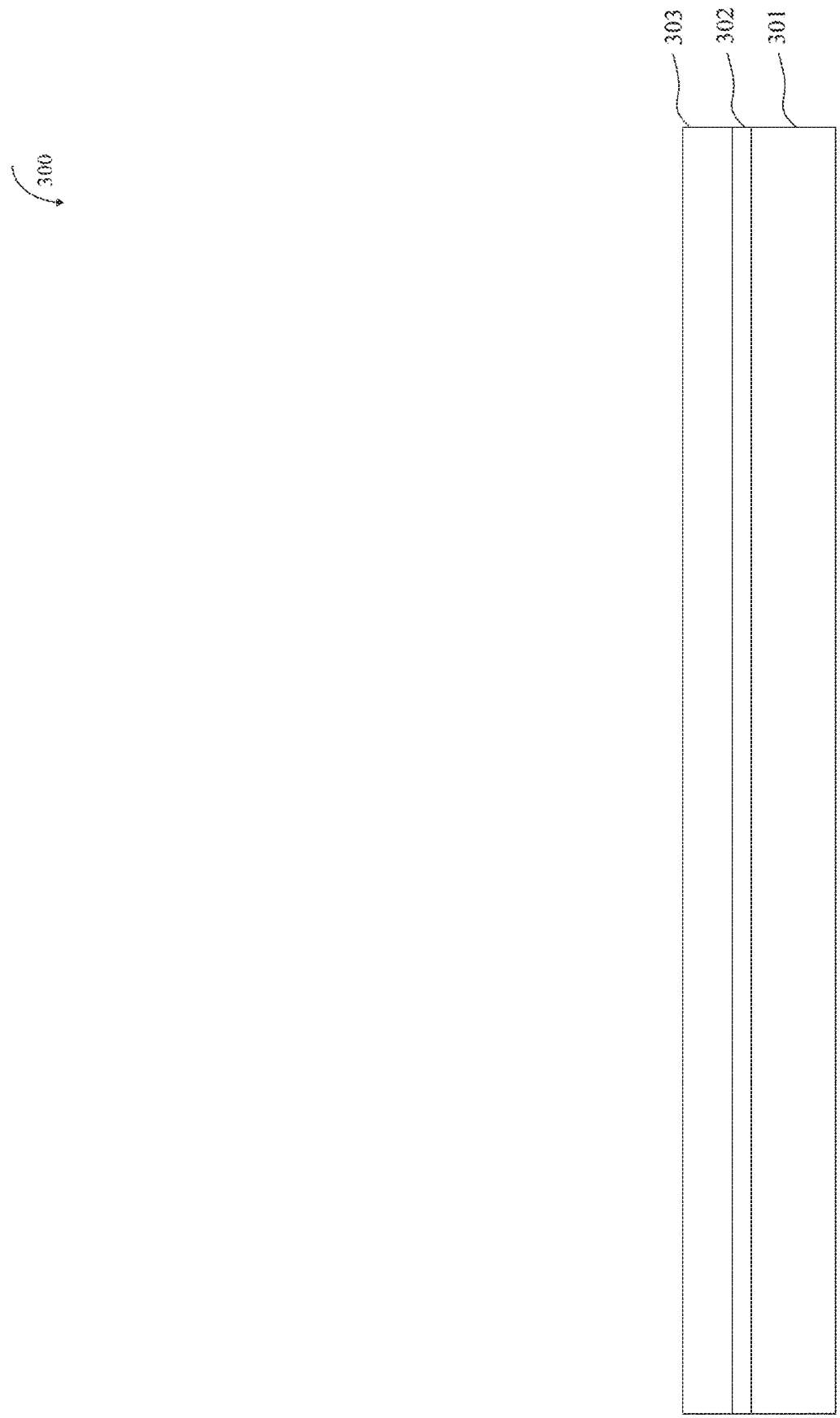
FIGS. 3-24 illustrate cross-sectional views of an exemplary Integrated Fan-Out (InFO) package, including the semiconductor structure as illustrated in FIG. 1A, at different stages of a manufacturing process in accordance with some embodiments of the present disclosure.

Refer to FIG. 3. In the embodiment illustrated in FIG. 3, a carrier 301, an adhesive layer 302, and a polymer base layer 303 are provided. In some embodiments, the carrier 301 includes glass, ceramic, or other suitable material to provide structural support during the formation of various features in device package. In some embodiments, the adhesive layer 302, including, for example, a glue layer, a light-to-heat conversion (LTHC) coating, an ultraviolet (UV) film or the like, is disposed over the carrier 301. The polymer base layer 303 is coated on the carrier 601 via the adhesive layer 602. In some embodiments, the polymer base layer 603 is formed of PBO, Ajinomoto buildup film (ABF), PI, BCB, solder resist (SR) film, die attach film (DAF), or the like, but the present disclosure is not limited thereto.

Figure 4:
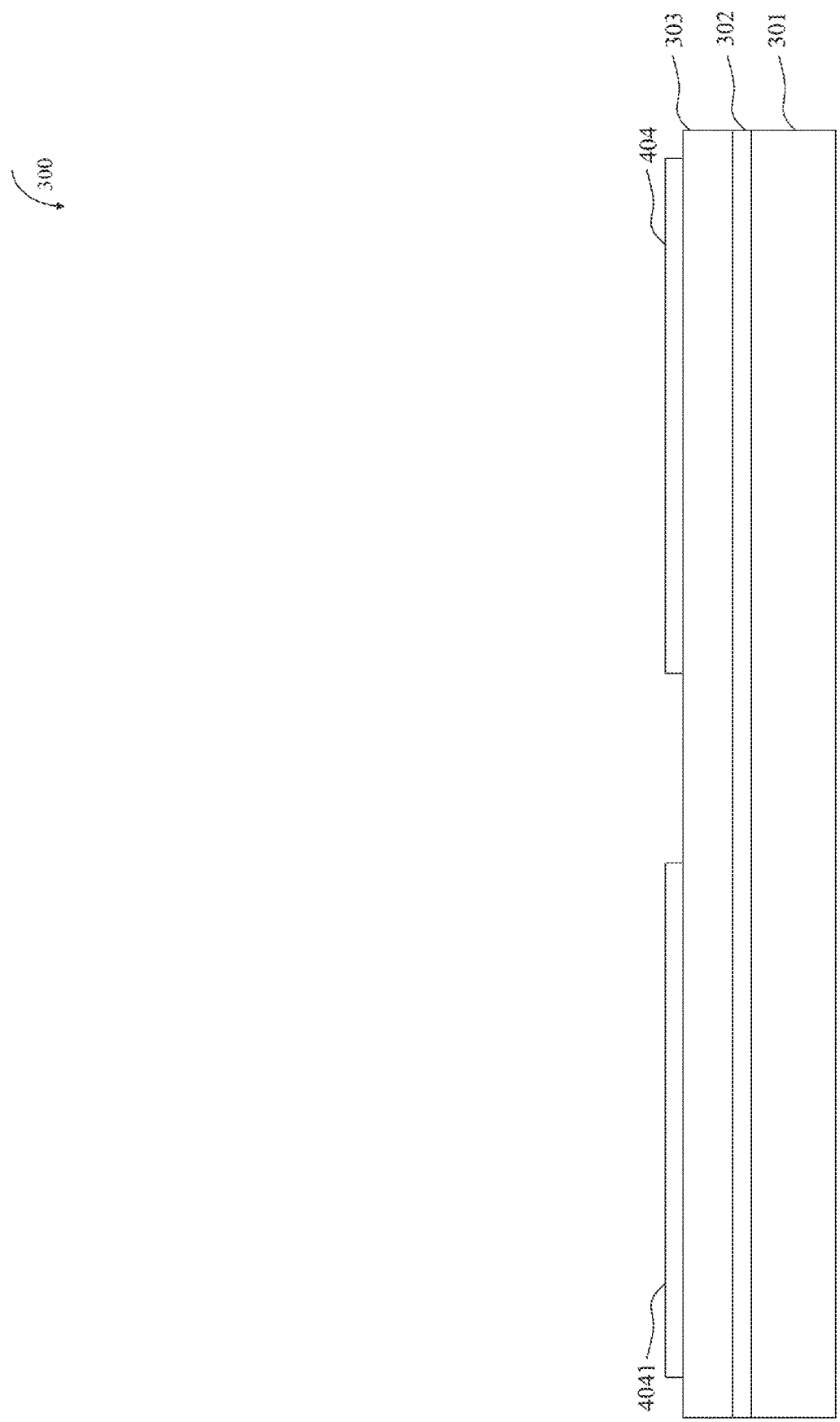

Next, in the embodiment illustrated in FIG. 4, a backside redistribution layer (RDL) 404 is formed on the polymer base layer 303. In some embodiments, the backside RDL 404 includes conductive features 4041 that further include, for example, conductive lines and/or vias, formed in one or more polymer layers. In some embodiments, the polymer layers are formed of any suitable material, including PI, PBO, BCB, epoxy, silicone, acrylates, nano-filled phenol resin, siloxane, a fluorinated polymer, polynorbornene, or the like, using any suitable method, including, for example, a spin-on coating technique, sputtering, and the like.

In some embodiments, the conductive features 4041 are formed in polymer layers. The formation of such conductive features 4041 includes patterning polymer layers, for example, using a combination of photolithography and etching processes, and forming the conductive features 4041 in the patterned polymer layers, for example, depositing a seed layer and using a mask layer to define the shape of the conductive features 4041. The conductive features 4041 are designed to form functional circuits and input/output features for subsequently attached dies.

Figure 5:
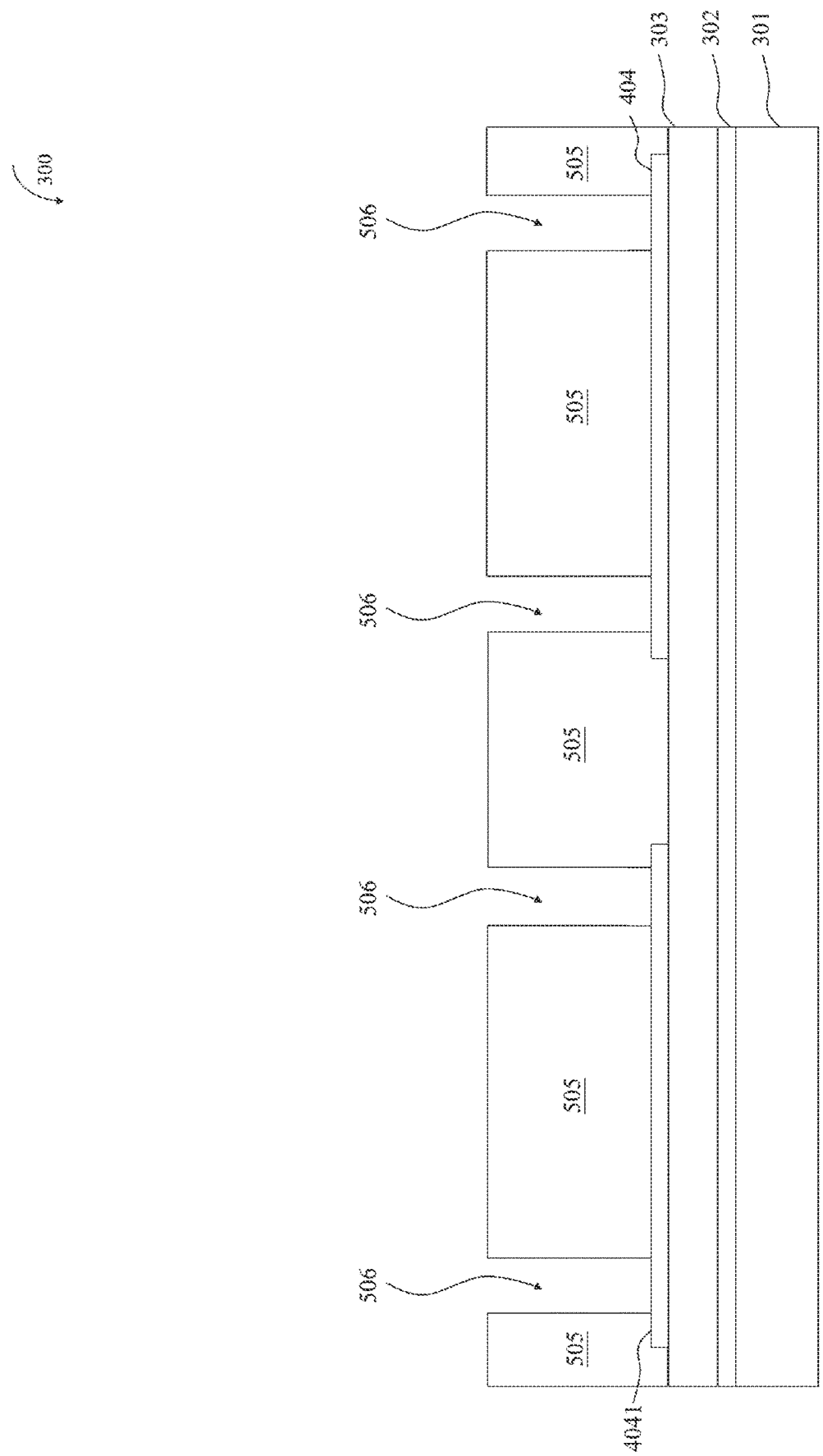

Next, a patterned photoresist 505 is formed over the backside RDL 404 and the carrier 301, as illustrated in the embodiment shown in FIG. 5. In some embodiments, for example, a photoresist is deposited as a blanket layer over the backside RDL 404. Next, portions of the deposited photoresist are exposed using a photo mask (not shown). Exposed or unexposed portions of the deposited photoresist are then removed depending on whether a negative or positive photoresist is used. The resulting patterned photoresist 505 includes openings 506 disposed at peripheral areas of the polymer base layer 303. In some embodiments, the openings 506 further expose conductive features 4041 in the backside RDL 404.

Figure 6:
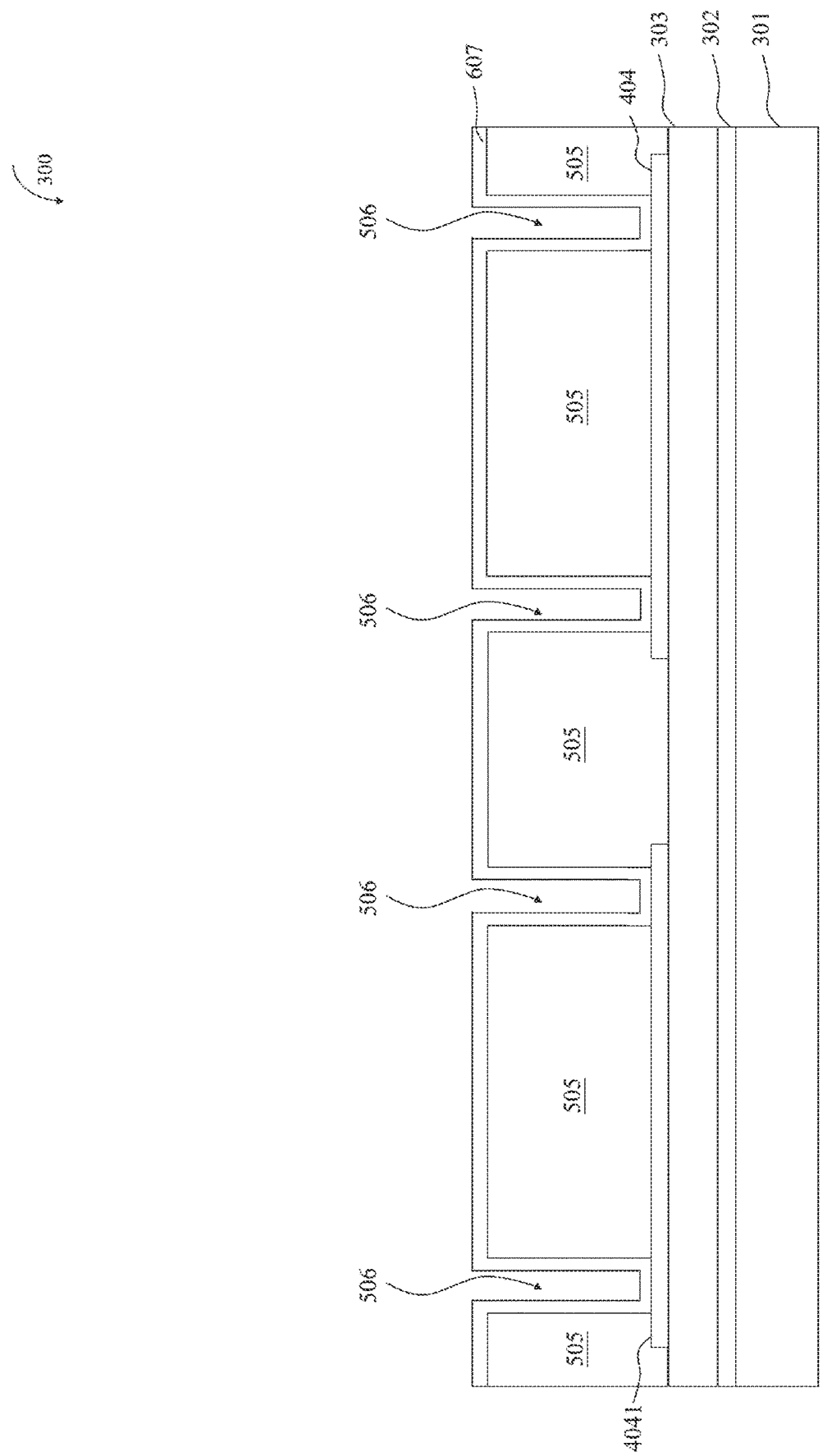

After the patterned photoresist 505 is formed over the backside RDL 404 and the carrier 301, a seed layer 607 is deposited overlying the patterned photoresist 505, as illustrated in the embodiment shown in FIG. 6.

Figure 7:
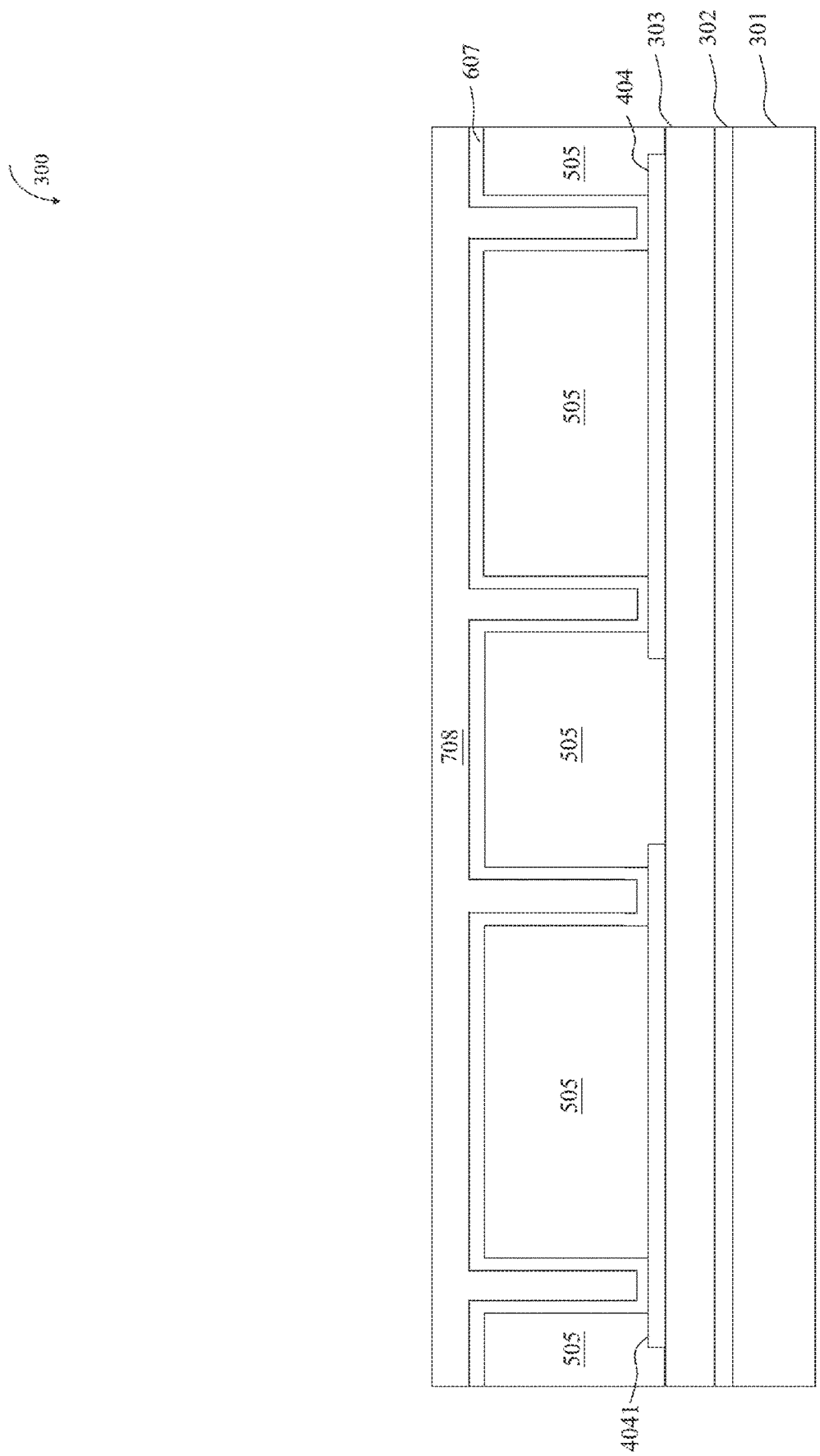
Figure 8:
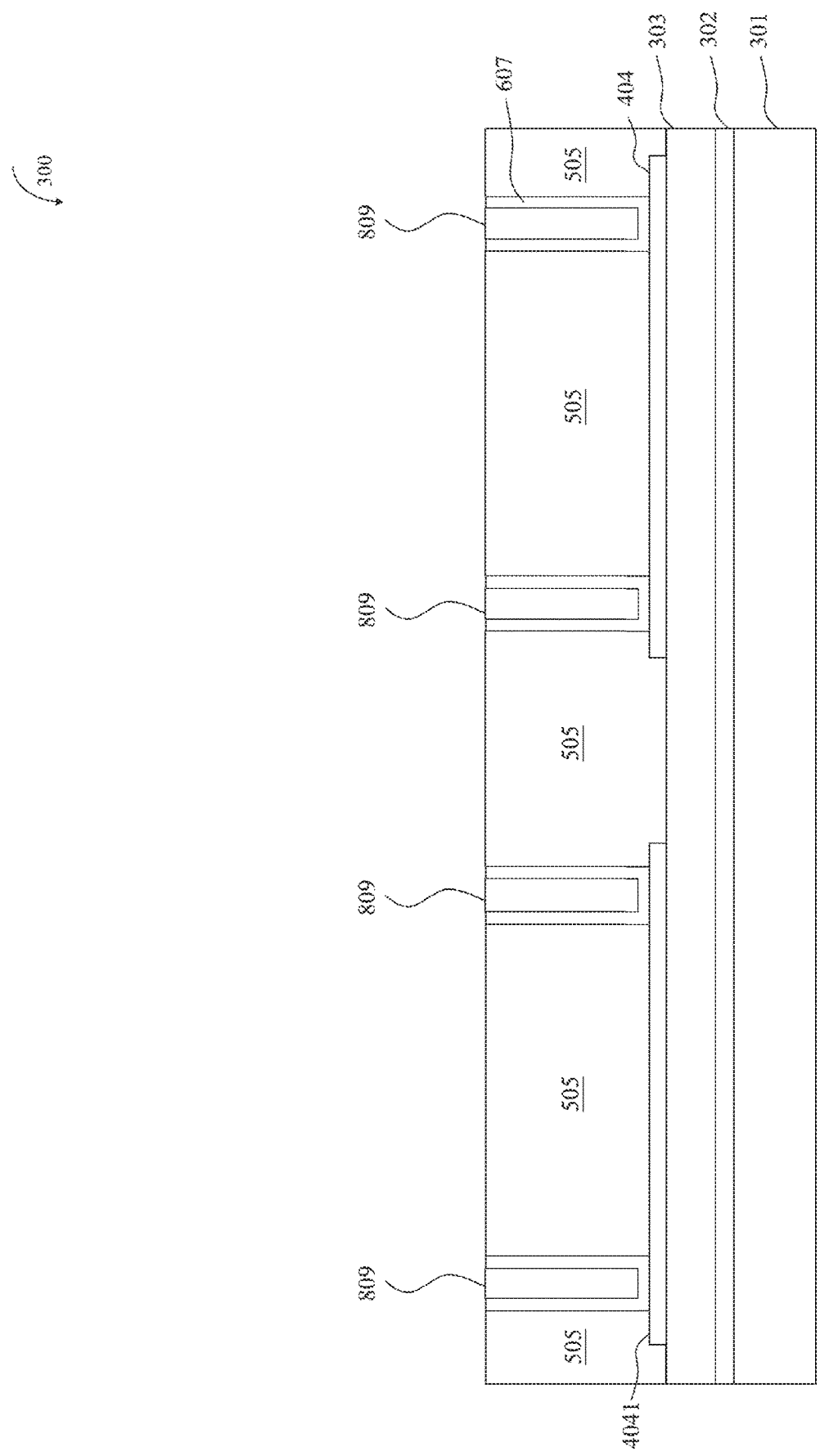

Next, the openings 506 are filled with a conductive material 708 including, for example, copper, silver, gold, and the like to form conductive vias, as illustrated in the embodiment shown in FIG. 7. In some embodiments, the openings 506 are plated with the conductive material 708 during a plating process, including, for example, electrochemically plating, electroless plating, or the like. In some embodiments, the conductive material 708 overfills the openings 506, and a grinding and a chemical mechanical polishing (CMP) process are performed to remove excess portions of the conductive material 708 over the patterned photoresist 505, as illustrated in the embodiment shown in FIG. 8. Conductive vias 809 are formed over the backside RDL 404 accordingly.

Figure 9:
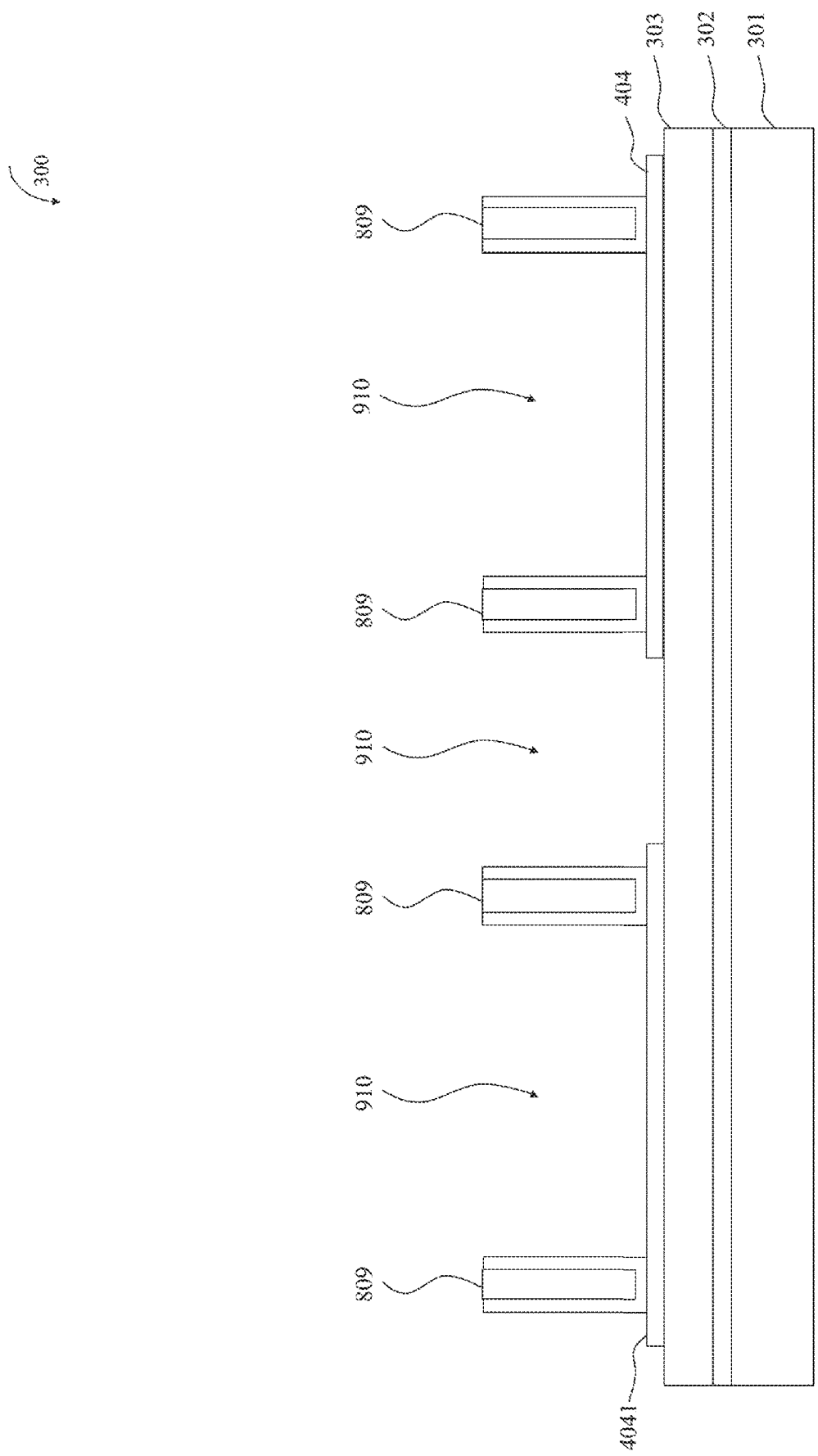

Additionally, the patterned photoresist 505 is removed, as illustrated in the embodiment shown in FIG. 9. In some embodiments, a plasma ashing or wet strip process is used to remove the patterned photoresist 505. In some embodiments, the plasma ashing process is followed by a wet dip in a sulfuric acid ($H_2SO_4$) solution to clean the package 300 and remove remaining photoresist material.

Alternatively, in some embodiments, the conductive vias 809 are replaced with conductive studs or conductive wires, including, for example, copper, gold, or silver wire. In some embodiments, the conductive vias 809 are spaced apart from each other by openings 910, and at least one opening 910 between adjacent conductive vias 809 is large enough to accommodate one or more semiconductor dies therein.

Figure 10:
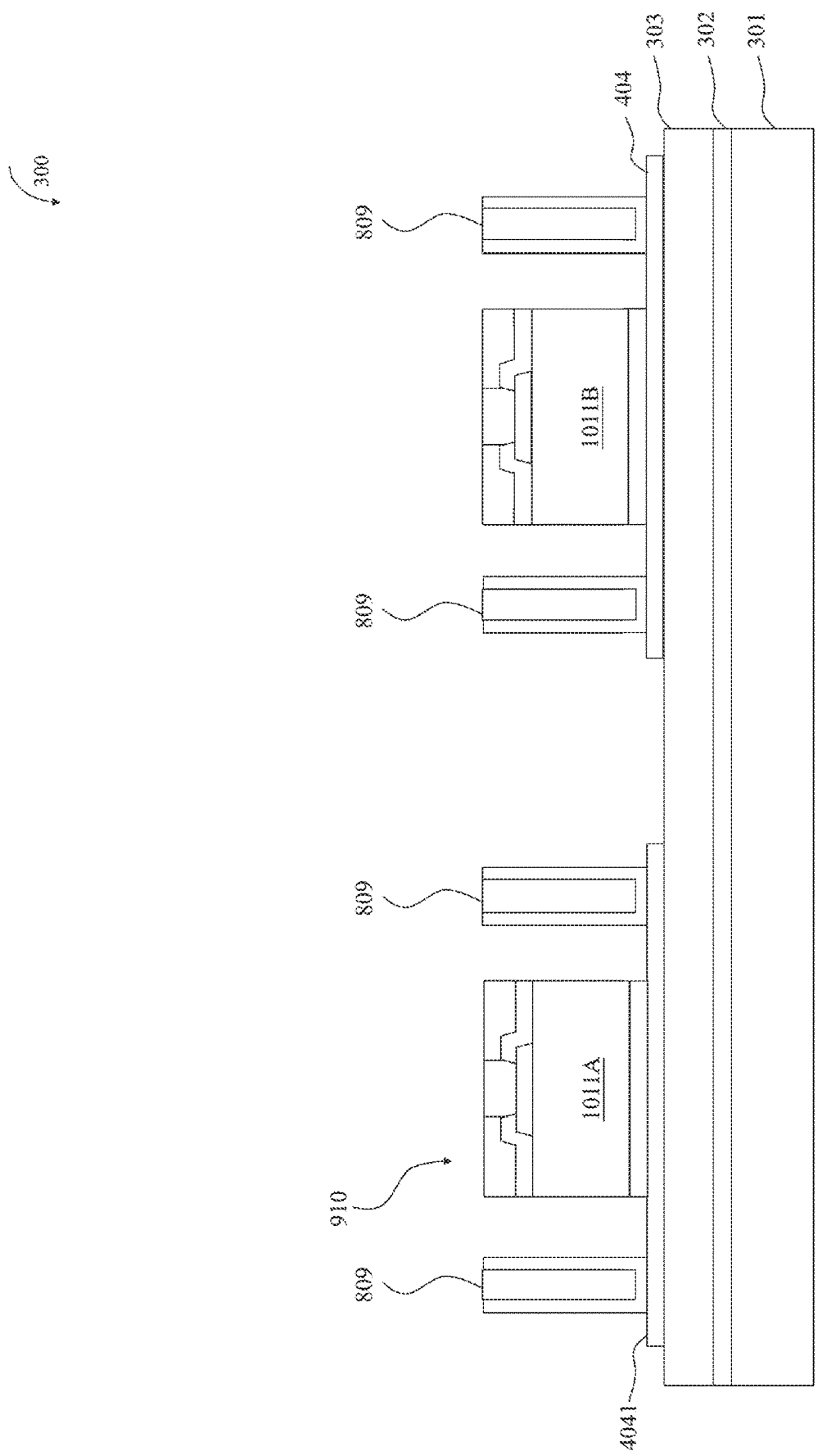

Next, a transmitter die 1011A and a receiver die 1011B are mounted and attached to the package 300, as illustrated in the embodiment shown in FIG. 10. In some embodiments, the transmitter die 1011A can include the transmitter circuit 140 shown in FIG. 1A, and/or the receiver die 1011B can include the receiver circuit 150 shown in FIG. 1A. In some embodiments, other interconnect structures including, for example, the conductive vias 809 electrically connected to the conductive features 4041 in the backside RDL 404 is also included. In some embodiments, an adhesive layer is used to affix the transmitter die 1011A and the receiver die 1011B to the backside RDL 604.

Figure 11:
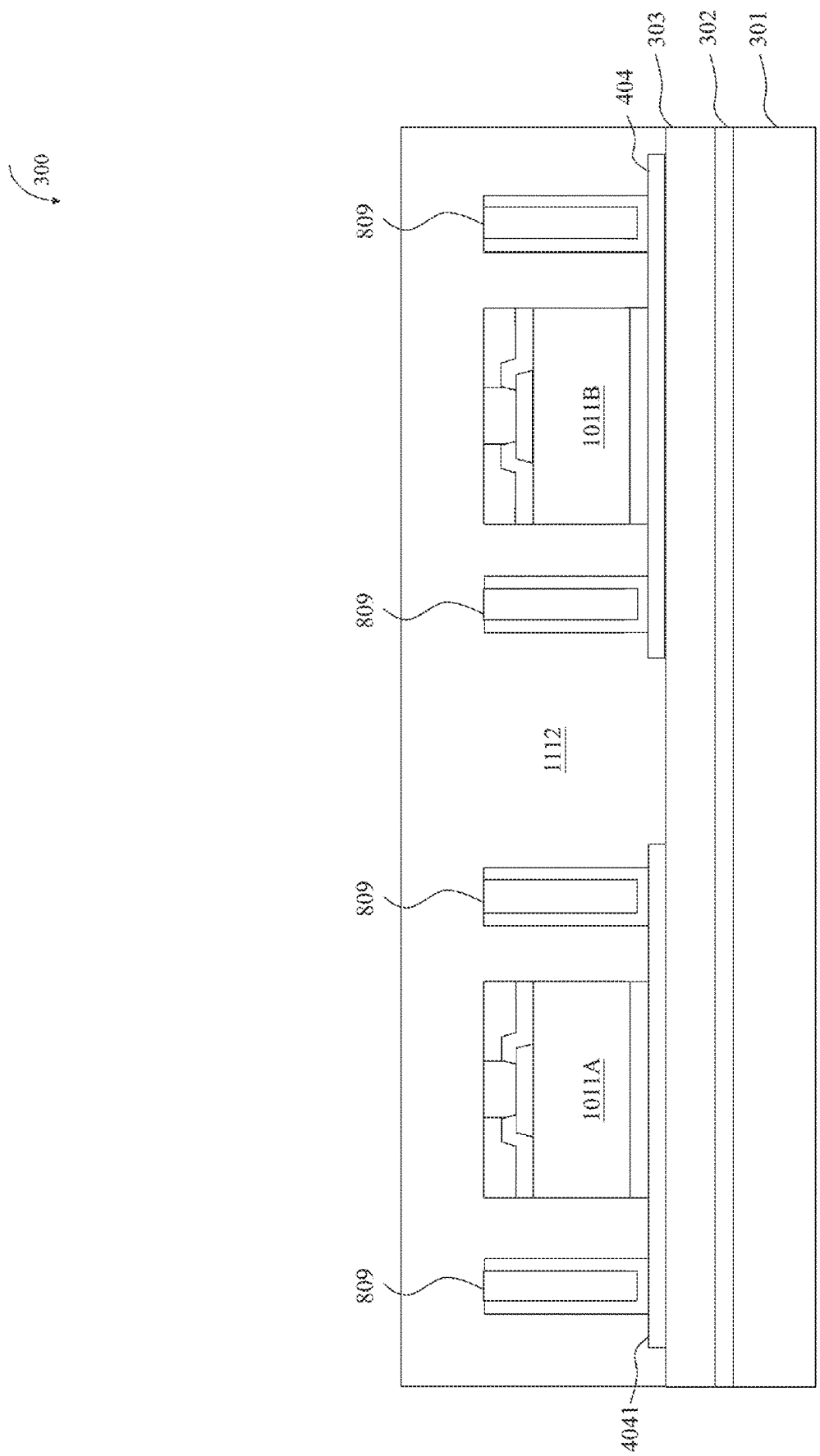

After the transmitter die 1011A and the receiver die 1011B are mounted to the backside RDL 404 in the openings 910, a molding compound 1112 is formed in the package 300, as illustrated in the embodiment shown in FIG. 11.

The molding compound 1112 can be arranged to surround the transmitter die 1011A and the receiver die 1011B. For example, the molding compound 1112 is dispensed to fill gaps between the transmitter die 1011A and the conductive vias 809, gaps between the adjacent conductive vias 809, and gaps between the receiver die 1011B and the conductive vias 809. In some embodiments, the molding compound 1112 includes any suitable material including, for example, an epoxy resin, a molding underfill, or the like. In some embodiments, compressive molding, transfer molding, and liquid encapsulant molding are suitable methods for forming the molding compound 1112, but the present disclosure is not limited thereto. For example, the molding compound 1112 is dispensed between the transmitter die 1011A, the receiver die 1011B and the conductive vias 809 in liquid form. Subsequently, a curing process is performed to solidify the molding compound 1112. In some embodiments, the filling of the molding compound 1112 overflows the transmitter die 1011A, the receiver die 1011B, and conductive vias 809 so that the molding compound 1112 covers top surfaces of the transmitter die 1011A, the receiver die 1011B and conductive vias 809.

Figure 12:
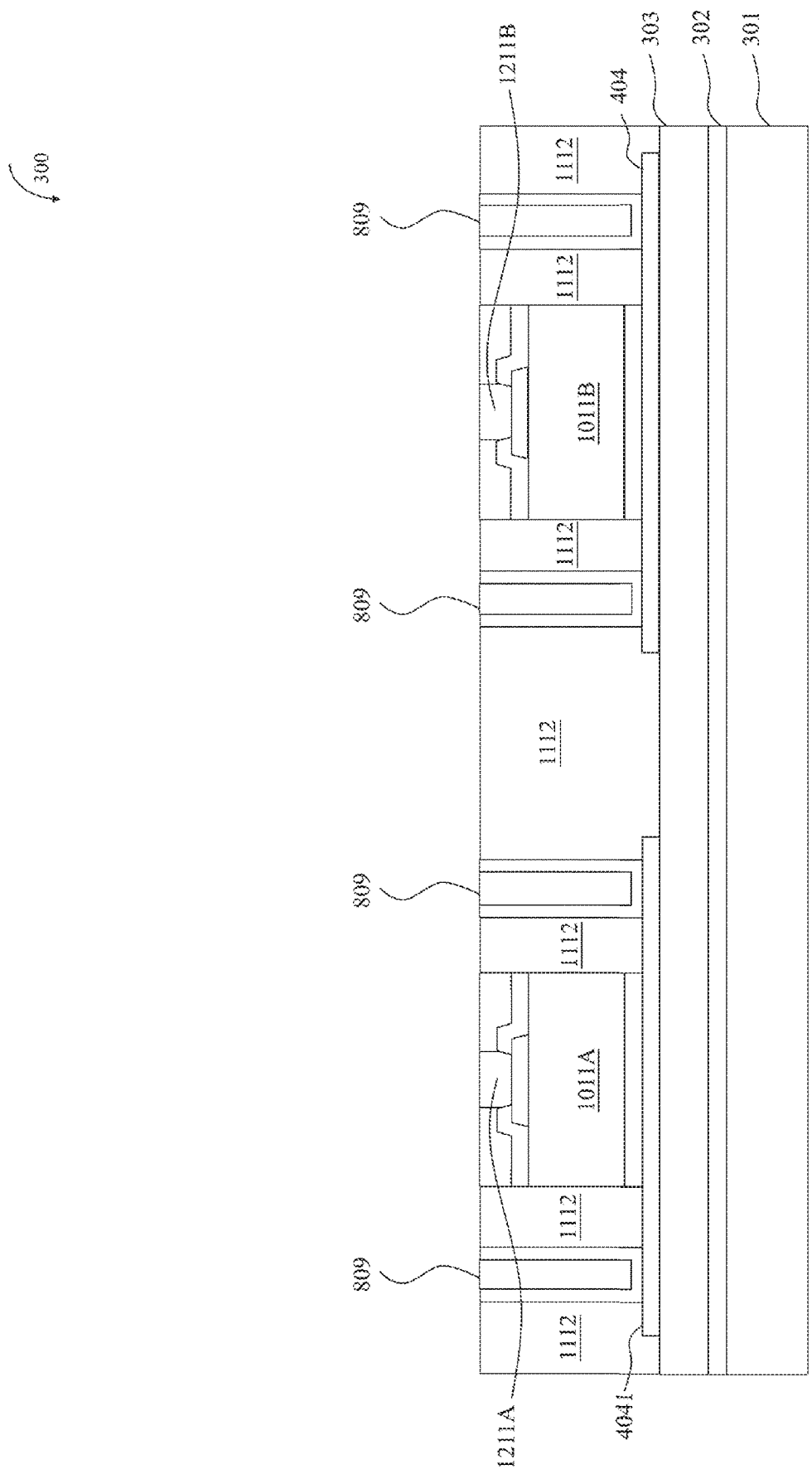

Next, a grinding and a CMP process are performed to remove excess portions of the molding compound 1112, and the molding compound 1112 is ground back to reduce its overall thickness and thus expose the conductive vias 809, as illustrated in the embodiment shown in FIG. 12.

Because the resulting structure includes the conductive vias 809 that extend through the molding compound 1112, the conductive vias 809 are also referred to as through molding vias, through inter vias (TIVs), and the like. The conductive vias 809 provide electrical connections to the backside RDL 404 in the package 300. In some embodiments, the thinning process used to expose the conductive vias 809 is further used to expose conductive pillar 1211A and conductive pillar 1211B.

Figure 13:
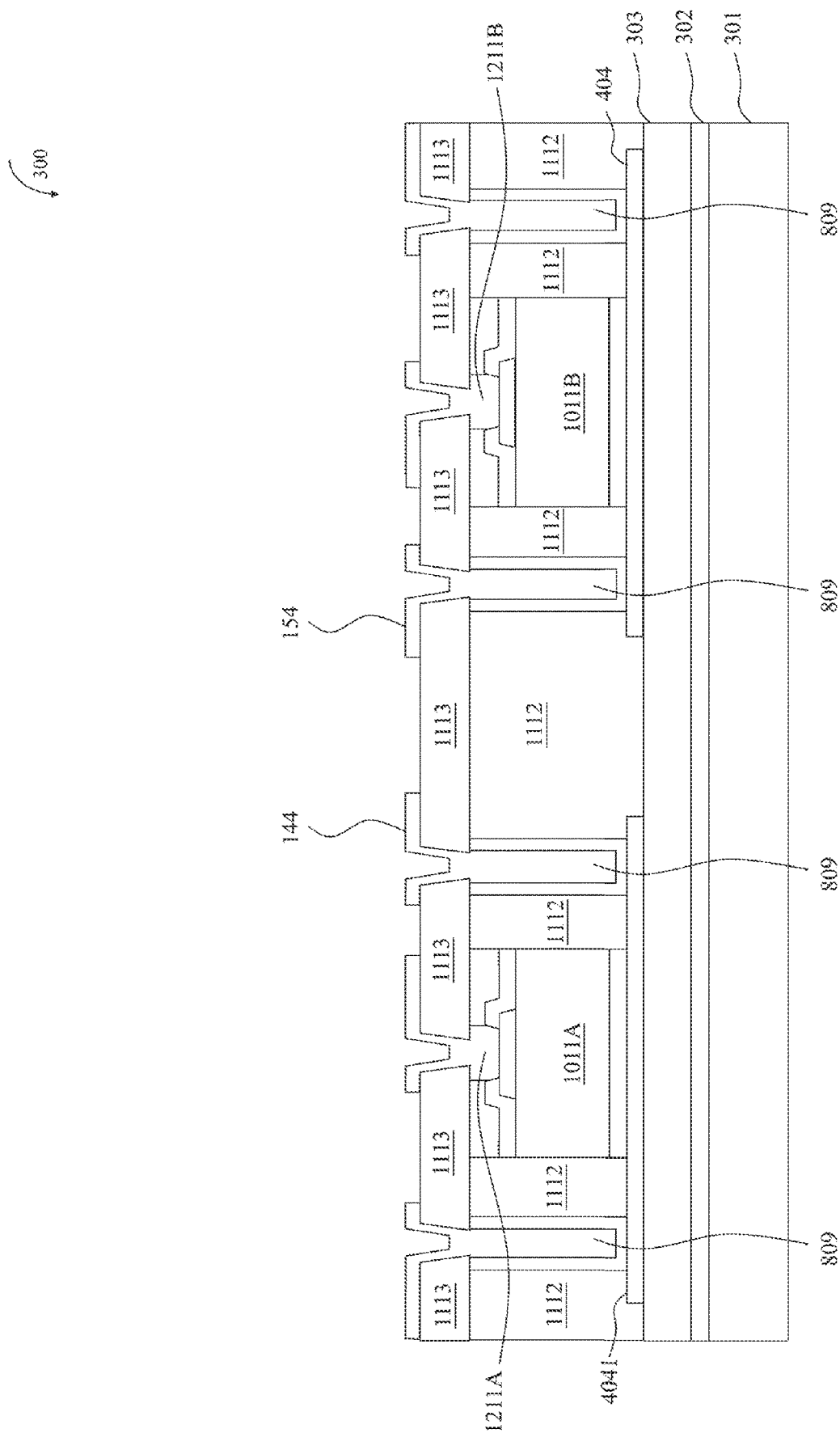

Next, a patterned polymer layer 1113 having openings is formed overlying the molding compound 1112, as illustrated in the embodiment shown in FIG. 13.

In some embodiments, the polymer layer 1113 includes PI, PBO, BCB, epoxy, silicone, acrylates, nano-filled phenol resin, siloxane, a fluorinated polymer, polynorbornene, or the like. In some embodiments, the polymer layer 613 is selectively exposed to an etchant, including, for example, $CF_4$, $CHF_3$, $C_4F_8$, HF, etc., configured to etch the polymer layer 1113 to form the openings. As shown in FIG. 13, the openings expose the conductive pillar 1211A and 1211B, and the conductive vias 809. In some embodiments, the openings include one or more via holes, and an overlying metal wire trench. The via holes vertically extend from a bottom surface of the polymer layer 1113 to a bottom surface of the metal trenches, which extend to a top surface of the polymer layer 1113.

In some embodiments, the openings are filled with a conductive material. For example, a seed layer (not shown) is formed in the openings and the conductive material is plated in the openings using an electrochemical plating process, an electroless plating process, or the like. The resulting via holes in the polymer layer 1113 are electrically connected to the conductive pillar 1211A, the conductive pillar 1211B or the conductive vias 809, and the transmitter electrode 144 and the receiver electrode 154 are formed within the polymer layer 1113. In some embodiments, the polymer layer 1113 is patterned to form openings, and a metal material is formed within the openings to form the transmitter electrode 144 and the receiver electrode 154. In some embodiments, the transmitter electrode 144 is laterally separated from the receiver electrode 154 by way of the polymer layer 1113. The transmitter electrode 144 and the receiver electrode 154 are electrically connected to a transmitter ground and a receiver ground respectively, such as the transmitter ground GT and the receiver ground RT shown in FIG. 1A, through the conductive vias 809 and the backside RDL 404. A transmitter/receiver ground voltage can be applied to the backside RDL 404. In some embodiments, the conductive material, including, for example, copper, is deposited by way of a deposition process, a subsequent plating process, and a CMP process, as described above, and thus detailed description is omitted for brevity.

Figure 14:
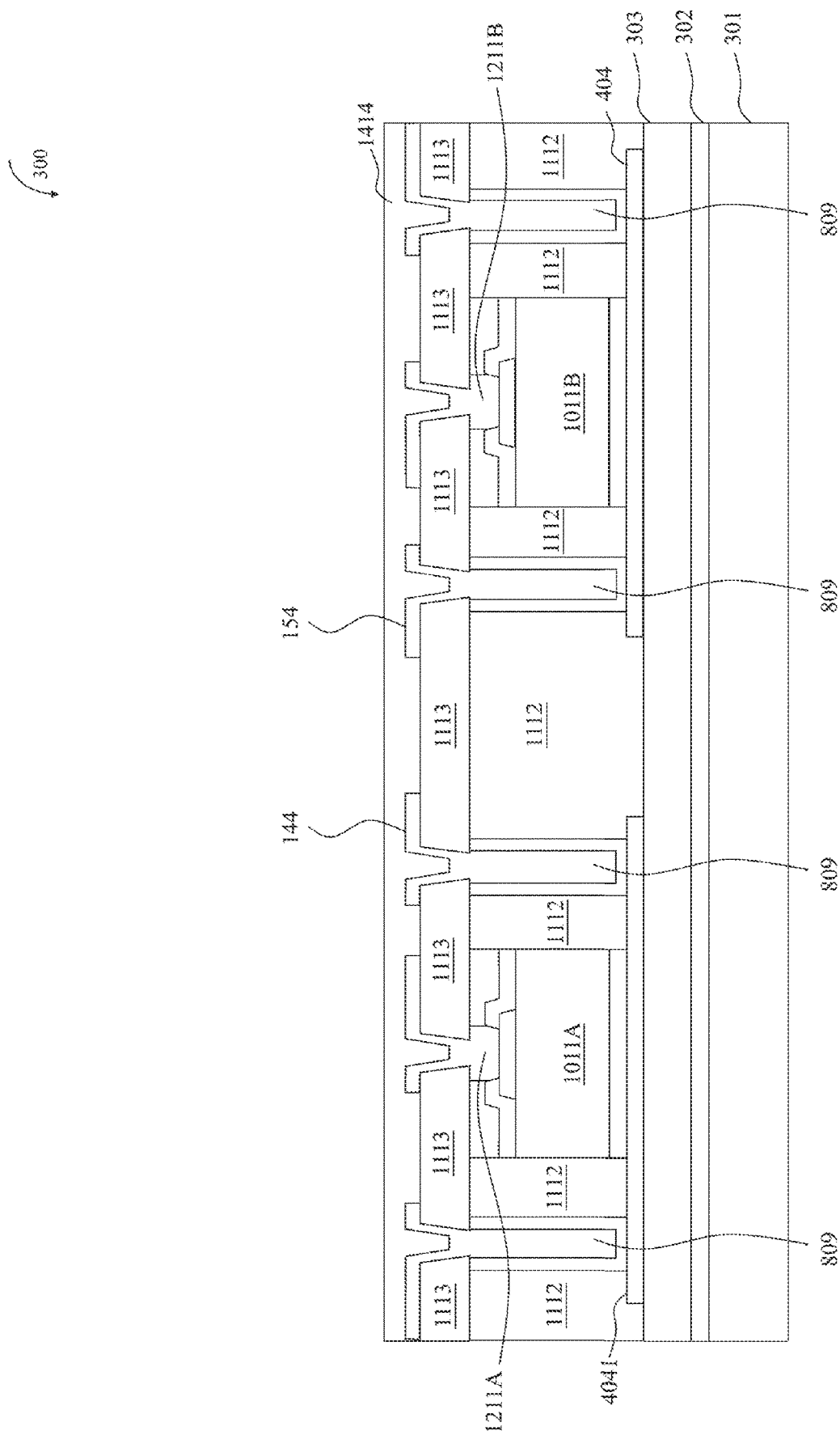
Figure 15:
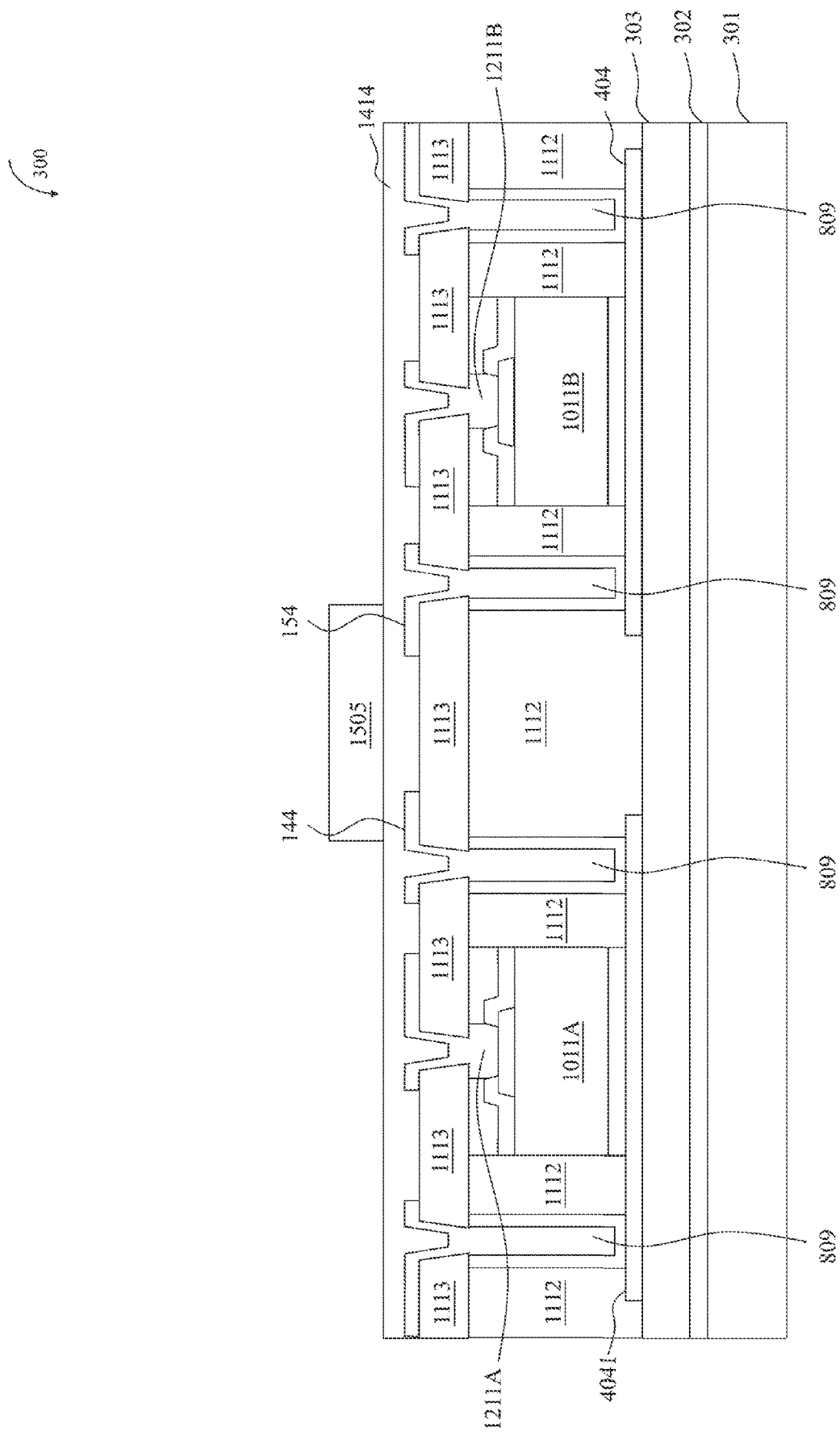

Next, a waveguide dielectric material 1414 is formed overlying the polymer layer 1113, as illustrated in the embodiment shown in FIG. 14.

Figure 19:
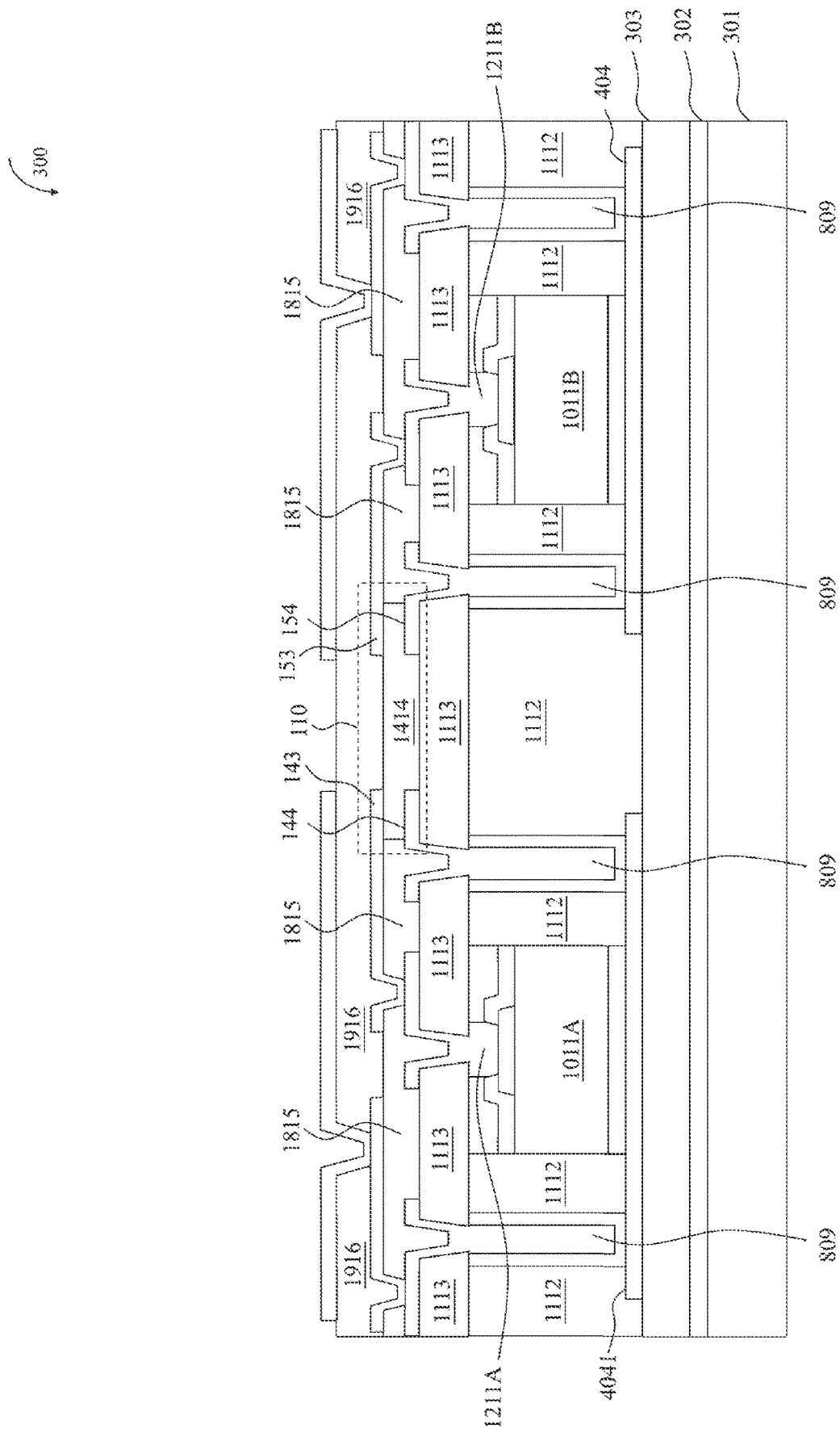

In some embodiments, the waveguide dielectric material 1414 includes a higher dielectric constant than the surrounding polymer layers including, for example, the polymer layer 1113 and 1916 shown in FIG. 19. In some embodiments, the waveguide dielectric material 1414 is formed by way of a vapor deposition technique, including, for example, PVD, CVD, or PECVD, to a thickness that overlies the polymer layer 1113. In some embodiments, a grinding and a CMP process are used to remove excess portions of the waveguide dielectric material 1414.

In some embodiments, the waveguide dielectric material 1414 includes room-temperature, e.g. 25° C., liquid-phase high-K polymer that includes, for example, PBO and PI. In some other embodiments, the waveguide dielectric material 1414 includes room-temperature or low-temperature, e.g. below 250° C., liquid-phase $SiO_2$ or Spin on Glass (SOG), of which the dielectric constant is greater than or equal to approximately 4. In some other embodiments, the waveguide dielectric material 1414 includes liquid phase $SiN_x$ or other high-K dielectric. In some other embodiments, the waveguide dielectric material 1414 includes low-temperature, e.g. 180° C., chemical vapor deposited $SiO_2$ (CVD-$SiO_2$), $SiN_x$ or $SiO_xN_y$ deposition, including, for example, atmospheric pressure CVD (APCVD), sub-atmospheric CVD (SACVD), plasma enhanced CVD (PECVD), metal organic CVD (MOCVD), etc. In some other embodiments, the waveguide dielectric material 1414 includes low-temperature, e.g. 210° C., high-K dielectric deposition including, for example, $ZrO_2$—$Al_2O_3$—$ZrO_2$ (ZAZ) or other High-K dielectric deposition including, for example, $ZrO_2$, $Al_2O_3$, $HfO_x$, $HfSiO_x$, $ZrTiO_x$, $TiO_2$, $TaO_x$, $PbZrTiO_3$ (PZT), $BaSrTiO_3$ (BST) and $BaTiO_3$ (BTO), etc. In some other embodiments, the waveguide dielectric material 1414 includes hybrid atomic layer deposited SrO (ALD-SrO) and chemical vapor deposited $RuO_2$ (CVD-$RuO_2$). For example, in some other embodiments, the waveguide dielectric material 1414 includes a $SrTiO_3$ (STO) dielectric layer.

The aforementioned materials are given for illustrative purposes. Various materials of the waveguide dielectric material 1414 are within the contemplated scoped of the present disclosure.

After deposition, the waveguide dielectric material 1414 is patterned to form the first dielectric waveguide 110 using photolithography and/or etching processes. For example, as illustrated in the embodiment shown in FIG. 15, a patterned photoresist 1505 is formed over the waveguide dielectric material 1414. Next, portions of the patterned photoresist 1505 are exposed using a photo mask (not shown). Exposed or unexposed portions of the patterned photoresist 1505 are then removed depending on whether a negative or positive photoresist is used. The resulting patterned photoresist 1505 includes portions disposed between the transmitter electrode 144 and the receiver electrode 154.

Figure 16:
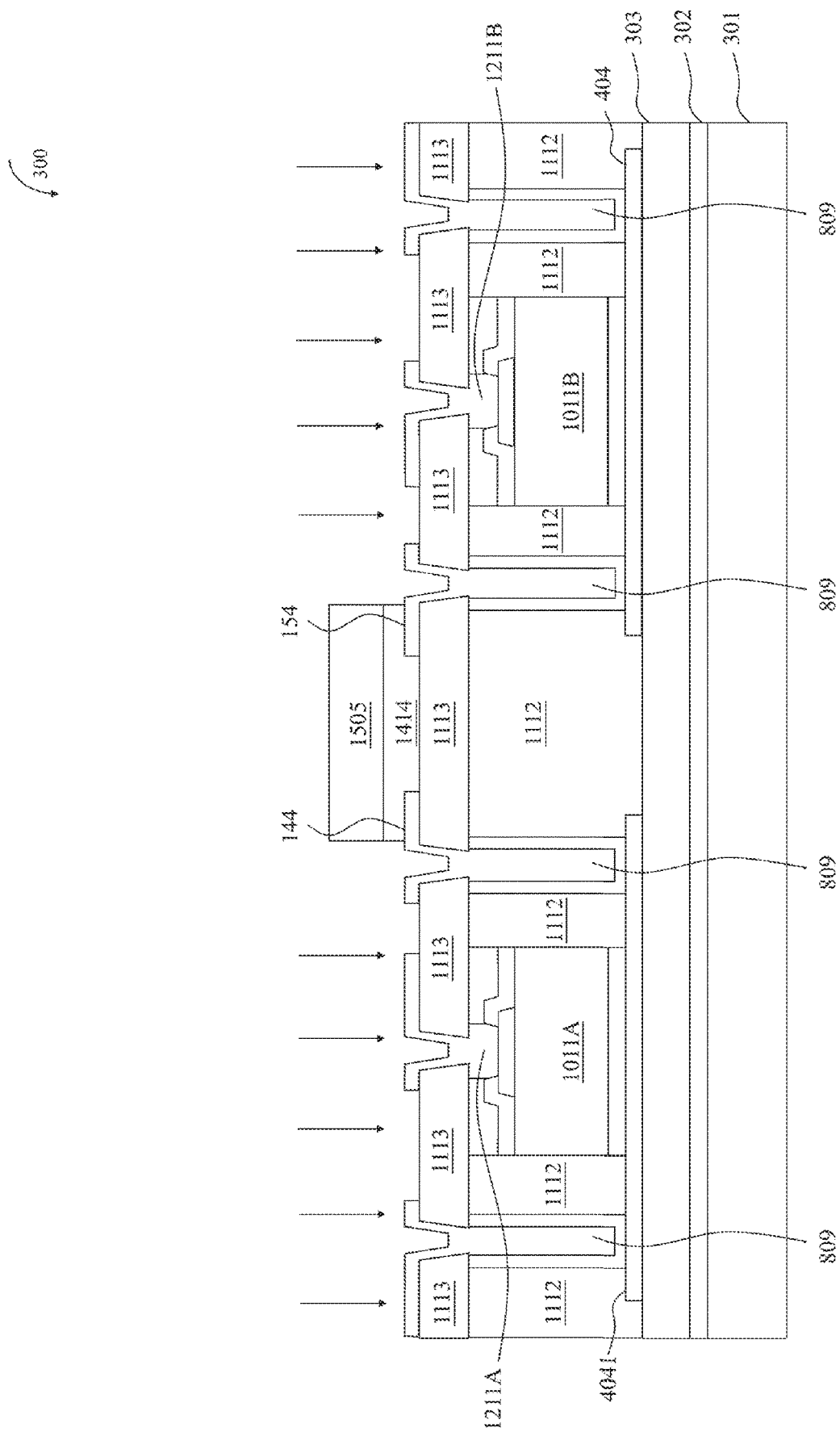

Next, an etching process is performed to remove the exposed portions of the waveguide dielectric material 1414, as illustrated in the embodiments shown in FIG. 16. In some embodiments, the etching process includes a reactive ion etching (RIE), but the present disclosure is not limited thereto.

Figure 17:
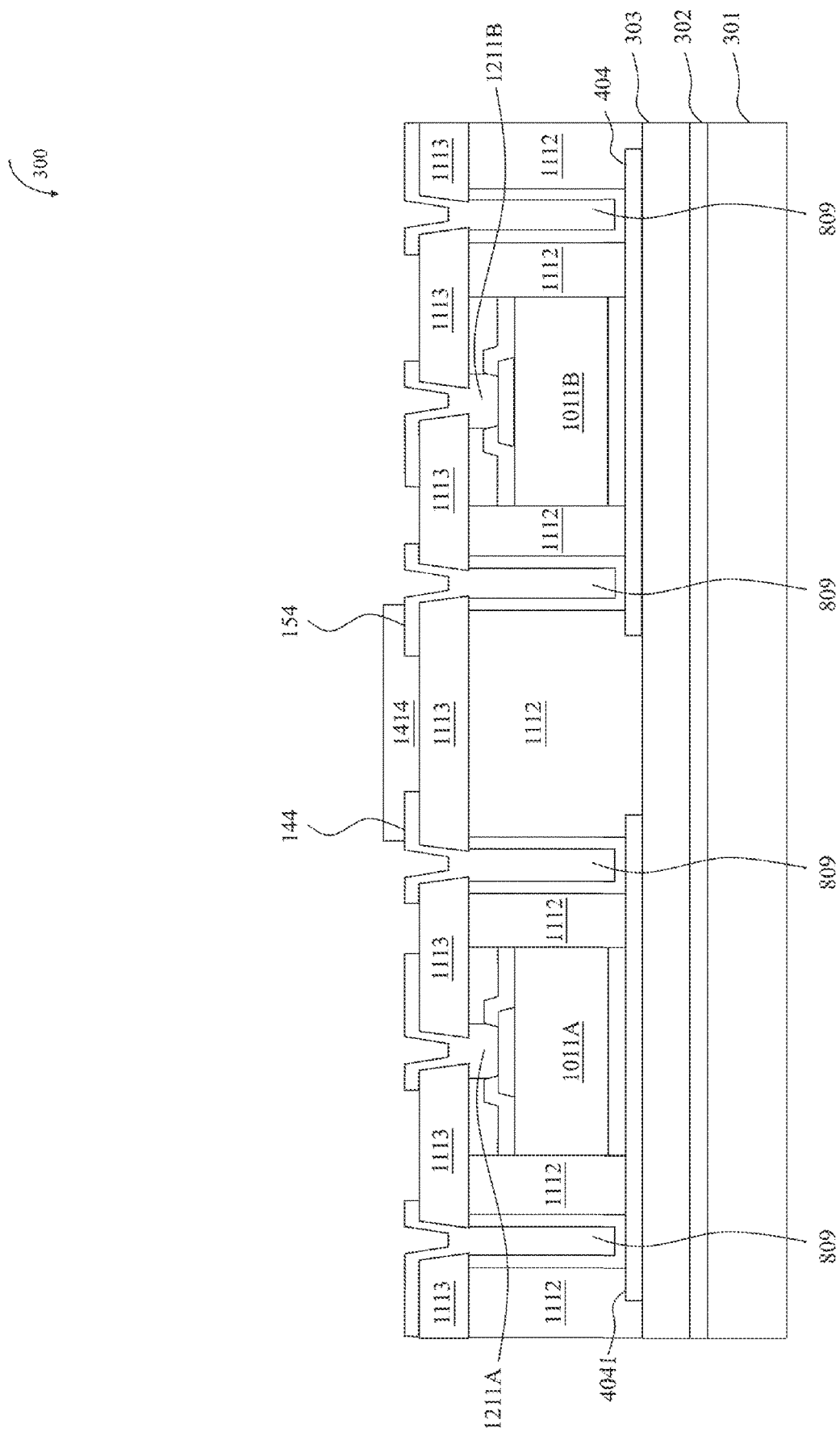

As illustrated in FIG. 17, the patterned photoresist 1505 is removed. In some embodiments, a plasma ashing or wet strip process is used to remove the patterned photoresist 1505. In some embodiments, the plasma ashing process is followed by a wet dip in a sulfuric acid ($H_2SO_4$) solution to clean the package 300 and remove remaining photoresist material.

Figure 18:
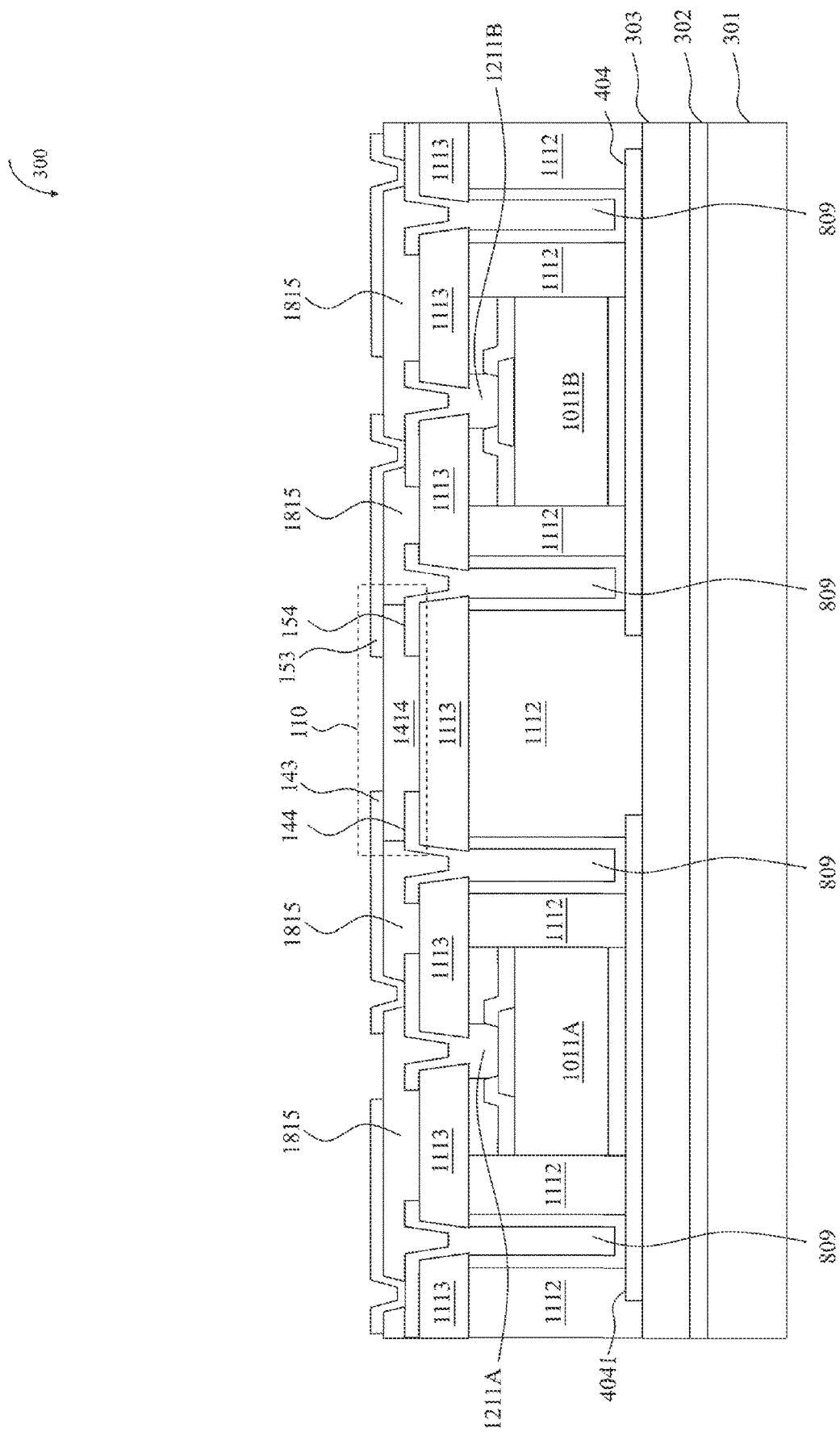

After the patterned photoresist 1505 is removed, a patterned polymer layer 1815 having openings is formed overlying the polymer layer 1113, as illustrated in FIG. 18.

In the embodiment shown in FIG. 18, the first dielectric waveguide 110 is disposed within the polymer layer 1815 or ILD material(s), and a dielectric constant of the waveguide dielectric material 1414 is greater than that of the polymer layer 1815. In some embodiments, the polymer layer 1815 includes PI, PBO, BCB, epoxy, silicone, acrylates, nano-filled phenol resin, siloxane, a fluorinated polymer, polynorbornene, or the like. In some embodiments, the polymer layer 1815 is selectively exposed to an etchant, including, for example, $CF_4$, $CHF_3$, $C_4F_8$, HF, etc., configured to etch the polymer layer 1815 to form the openings. In some embodiments, the openings include one or more via holes, and an overlying metal wire trench. The via holes vertically extend from a bottom surface of the polymer layer 1815 to a bottom surface of the metal trenches, which extend to a top surface of the polymer layer 1815.

In some embodiments, the openings are filled with a conductive material. For illustration, a seed layer (not shown) is formed in the openings and the conductive material is plated in the openings using, for example, an electrochemical plating process, an electroless plating process, or the like. The resulting via holes in the polymer layer 1815 are electrically connected to the conductive pillar 1211A, the conductive pillar 1211B or the conductive vias 809, and the transmitter electrode 143 and the receiver electrode 153 are formed within the polymer layer 1815. In some embodiments, the conductive material, including, for example, copper, is deposited by way of a deposition process, a subsequent plating process, and a CMP process, as described above, and thus detailed description is omitted for brevity.

In some embodiments, the transmitter die 1011A and the receiver die 1011B are electrically connected to the transmitter electrode 143 and the receiver electrode 153 respectively via the conductive features in the RDLs. The transmitter die 1011A is electrically connected to the transmitter electrode 143 through the conductive pillar 1211A and the conductive vias. The receiver die 1011B is electrically connected to the receiver electrode 153 through the conductive pillar 1211B and the conductive vias. In some embodiments, the RDLs formed in the polymer layers are substantially similar to the backside RDL 404 both in composition and formation process, and thus detailed description is omitted for brevity.

Next, one or more additional polymer layers 1916 having conductive features are formed over the polymer layer 1815, as illustrated in the embodiment shown in FIG. 19.

RDLs having conductive features are formed in the polymer layer 1916. In some embodiments, the RDLs include conductive features disposed between various polymer layers. In the embodiment shown in FIG. 19, the transmitter electrode 143 and the receiver electrode 153 are formed within the polymer layer 1916. In some embodiments, the polymer layer 1916 is patterned to form openings, and a metal material is formed within the openings to form the transmitter electrode 143 and the receiver electrode 153. In some embodiments, the transmitter electrode 143 is laterally separated from the receiver electrode 153 by way of the polymer layer 1916.

In some embodiments, the polymer layer 1916 includes PI, PBO, BCB, epoxy, silicone, acrylates, nano-filled phenol resin, siloxane, a fluorinated polymer, polynorbornene, or the like. In some embodiments, a dielectric constant of the first dielectric waveguide 110, disposed between two ILD materials, is greater than respective dielectric constants of these two ILD materials. For example, a dielectric constant of the waveguide dielectric material 1414 is greater than a dielectric constant of the polymer layer 1113 and a dielectric constant of the polymer layer 1916.

In some embodiments, the polymer layer 1916 is selectively exposed to an etchant, including, for example, $CF_4$, $CHF_3$, $C_4F_8$, HF, etc., configured to etch the polymer layer 1916 to form the openings. In some embodiments, the openings include one or more via holes, and an overlying metal wire trench. The via holes vertically extend from a bottom surface of the polymer layer 1916 to a bottom surface of the metal trenches, which extend to a top surface of the polymer layer 1916.

In some embodiments, the openings are filled with a conductive material. For illustration, a seed layer (not shown) is formed in the openings and the conductive material is plated in the openings using, for example, an electrochemical plating process, an electroless plating process, or the like. The resulting via holes in the polymer layer 1916 are electrically connected to the conductive vias 809 and the backside RDL 404, and the transmitter electrode 147 and the receiver electrode 157 are formed within the polymer layer 1916. The transmitter electrode 147 and the receiver electrode 157 are electrically connected to a transmitter ground and a receiver ground respectively, such as the transmitter ground GT and the receiver ground RT shown in FIG. 1A, through the conductive vias 809 and the backside RDL 404. A transmitter/receiver ground voltage can be applied to the backside RDL 404. The transmitter electrode 147 is laterally separated from the receiver electrode 157 by way of the polymer layer 1916. In some embodiments, the conductive material, including, for example, copper, is deposited by way of a deposition process, a subsequent plating process, and a CMP process, as described above, and thus detailed description is omitted for brevity.

Figure 20:
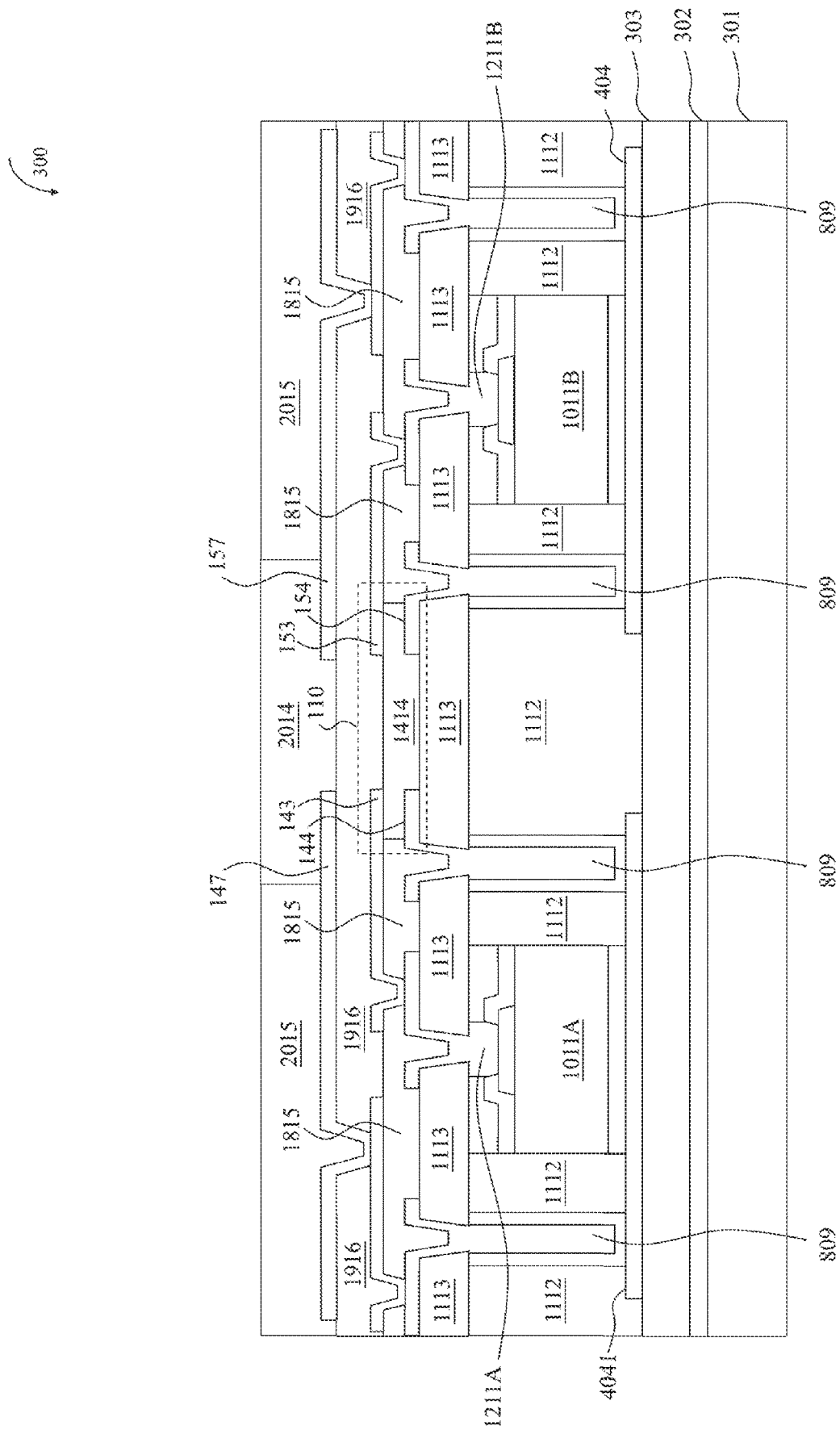

Next, a waveguide dielectric material 2014 and a polymer layer 2015 is formed overlying the polymer layer 1916, as illustrated in the embodiment shown in FIG. 20.

Figure 21:
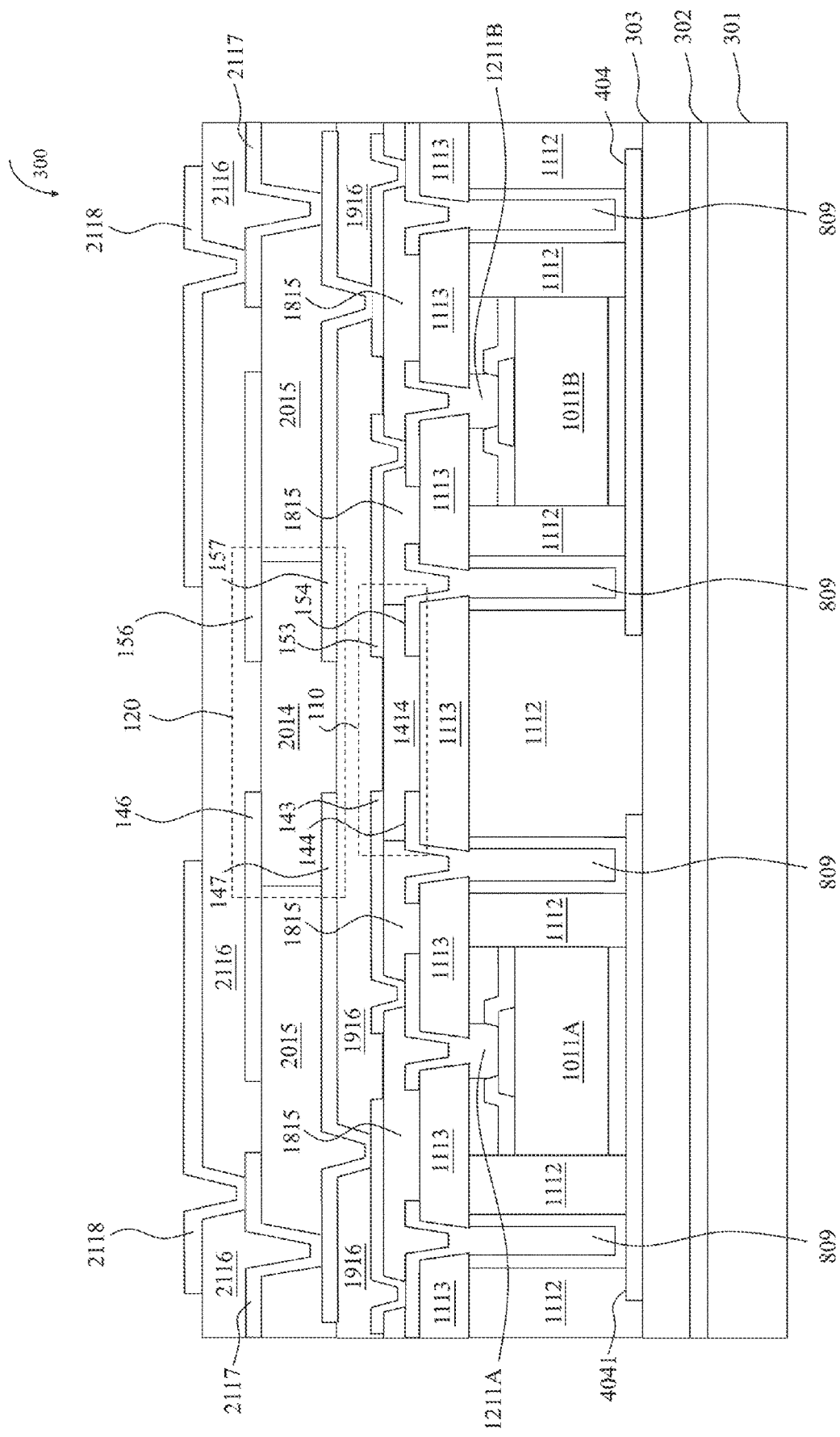

In some embodiments, the waveguide dielectric material 2014 includes a higher dielectric constant than the surrounding polymer layers including, for example, the polymer layer 1916 and 2116 (shown in FIG. 21). In some embodiments, the waveguide dielectric material 2014 is formed by way of a vapor deposition technique, including, for example, PVD, CVD, or PECVD, to a thickness that overlies the polymer layer 1916. In some embodiments, a grinding and a CMP process are used to remove excess portions of the waveguide dielectric material 2014.

In some embodiments, the waveguide dielectric material 2014 includes room-temperature, e.g. 25° C., liquid-phase high-K polymer that includes, for example, PBO and PI. In some other embodiments, the waveguide dielectric material 2014 includes room-temperature or low-temperature, e.g. below 250° C., liquid-phase $SiO_2$ or SOG, of which the dielectric constant is greater than or equal to approximately 4. In some other embodiments, the waveguide dielectric material 2014 includes liquid phase $SiN_x$ or other high-K dielectric. In some other embodiments, the waveguide dielectric material 2014 includes low-temperature, e.g. 180° C., chemical vapor deposited $SiO_2$ (CVD-$SiO_2$), $SiN_x$ or $SiO_xN_y$, deposition, including, for example, atmospheric pressure CVD (APCVD), sub-atmospheric CVD (SACVD), plasma enhanced CVD (PECVD), metal organic CVD (MOCVD), etc. In some other embodiments, the waveguide dielectric material 2014 includes low-temperature, e.g. 210° C., high-K dielectric deposition including, for example, $ZrO_2$—$Al_2O_3$—$ZrO_2$ (ZAZ) or other High-K dielectric deposition including, for example, $ZrO_2$, $Al_2O_3$, $HfO_x$, $HfSiO_x$, $ZrTiO_x$, $Y_2O_3$, $TiO_2$, $TaO_x$, $PbZrTiO_3$ (PZT), BaSrTiO$_3$ (BST) and BaTiO$_3$ (BTO), etc. In some other embodiments, the waveguide dielectric material 1414 includes hybrid atomic layer deposited SrO (ALD-SrO) and chemical vapor deposited $RuO_2$ (CVD-$RuO_2$). For example, in some other embodiments, the waveguide dielectric material 1414 includes a $SrTiO_3$ (STO) dielectric layer.

The aforementioned materials are given for illustrative purposes. Various materials of the waveguide dielectric material 2014 are within the contemplated scoped of the present disclosure.

In some embodiments, the waveguide dielectric material 2014 is formed by way of photolithography and/or etching processes as described above, and thus detailed description is omitted for brevity. After the waveguide dielectric material 2014 is formed, the patterned polymer layer 2015 accordingly. In some embodiments, the polymer layer 2015 includes PI, PBO, BCB, epoxy, silicone, acrylates, nano-filled phenol resin, siloxane, a fluorinated polymer, polynorbornene, or the like.

Next, the polymer layer 2015 is selectively exposed to an etchant, including, for example, $CF_4$, $CHF_3$, $C_4F_8$, HF, etc., configured to etch the polymer layer 2015 to form the openings, as illustrated in the embodiment shown in FIG. 21. In some embodiments, the openings include one or more via holes, and an overlying metal wire trench. The via holes vertically extend from a bottom surface of the polymer layer 2015 to a bottom surface of the metal trenches, which extend to a top surface of the polymer layer 2015.

In some embodiments, the openings are filled with a conductive material. For illustration, a seed layer (not shown) is formed in the openings and the conductive material is plated in the openings using, for example, an electrochemical plating process, an electroless plating process, or the like. The resulting via holes in the polymer layer 2015 are electrically connected to the conductive pillar 1211A, the conductive pillar 1211B or the conductive vias 809, and the transmitter electrode 146 and the receiver electrode 156 are formed within the polymer layer 2015. In some embodiments, the polymer layer 2015 is patterned to form openings, and a metal material is formed within the openings to form the transmitter electrode 146 and the receiver electrode 156. In some embodiments, the transmitter electrode 146 is laterally separated from the receiver electrode 156 by way of the polymer layer 2015. The transmitter electrode 146 is electrically connected to the transmitter die 1011A through the conductive pillar 1211A and conductive vias (not shown), and the receiver electrode 156 is electrically connected to the receiver die 1011B through the conductive pillar 1211B and conductive vias (not shown). In some embodiments, the conductive material, including, for example, copper, is deposited by way of a deposition process, a subsequent plating process, and a CMP process, as described above, and thus detailed description is omitted for brevity.

Additionally, RDLs 2117 having conductive features are formed in the polymer layer 2116, and one or more additional polymer layers 2116 having conductive features are formed over the polymer layer 2015, as illustrated in FIG. 21.

RDLs 2118 having conductive features are formed in the polymer layer 2116. In some embodiments, the RDLs 2117 and 2118 include the conductive features disposed between various polymer layers. In the embodiment shown in FIG. 21, the transmitter electrode 146 and the receiver electrode 156 are formed within the polymer layer 2116. In some embodiments, the polymer layer 2116 is patterned to form openings, and a metal material is formed within the openings to form the transmitter electrode 146 and the receiver electrode 156. In some embodiments, the transmitter electrode 146 is laterally separated from the receiver electrode 156 by way of the polymer layer 2116.

In some embodiments, the polymer layer 2116 includes PI, PBO, BCB, epoxy, silicone, acrylates, nano-filled phenol resin, siloxane, a fluorinated polymer, polynorbornene, or the like. In some embodiments, a dielectric constant of the second dielectric waveguide 120, disposed between two ILD materials, is greater than respective dielectric constants of these two ILD materials. For example, a dielectric constant of the waveguide dielectric material 2014 is greater than a dielectric constant of the polymer layer 1916 and a dielectric constant of the polymer layer 2116.

Figure 22:
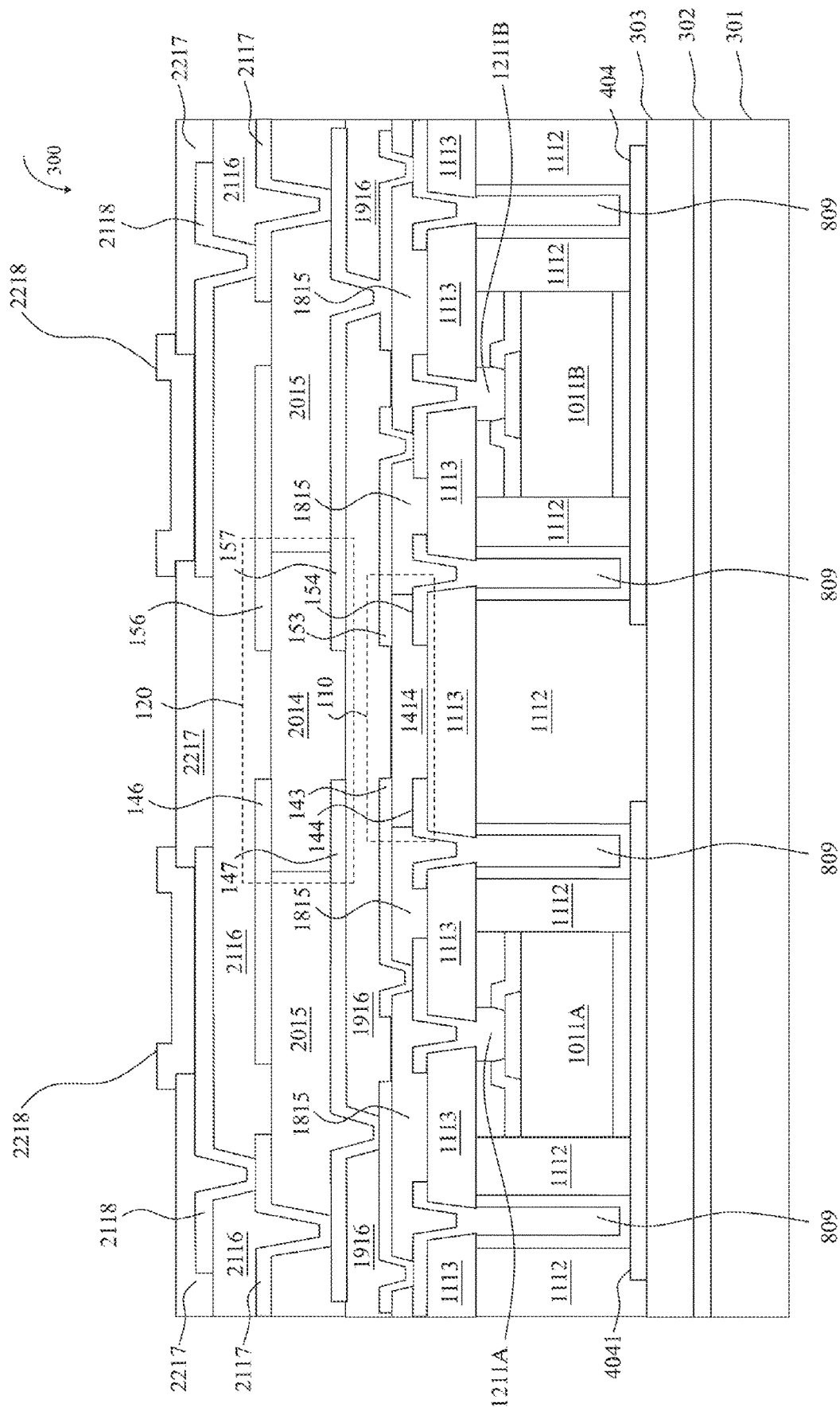

Next, as illustrated in the embodiment shown in FIG. 22, under bump metallurgies (UBMs) 2218 are then formed to electrically connect to the transmitter electrode 144, the transmitter electrode 147, the receiver electrode 154 and the receiver electrode 157 through the RDLs in the polymer layers 1916 and 2116, and a polymer layer 2217 is formed over the polymer layer 2116.

Figure 23:
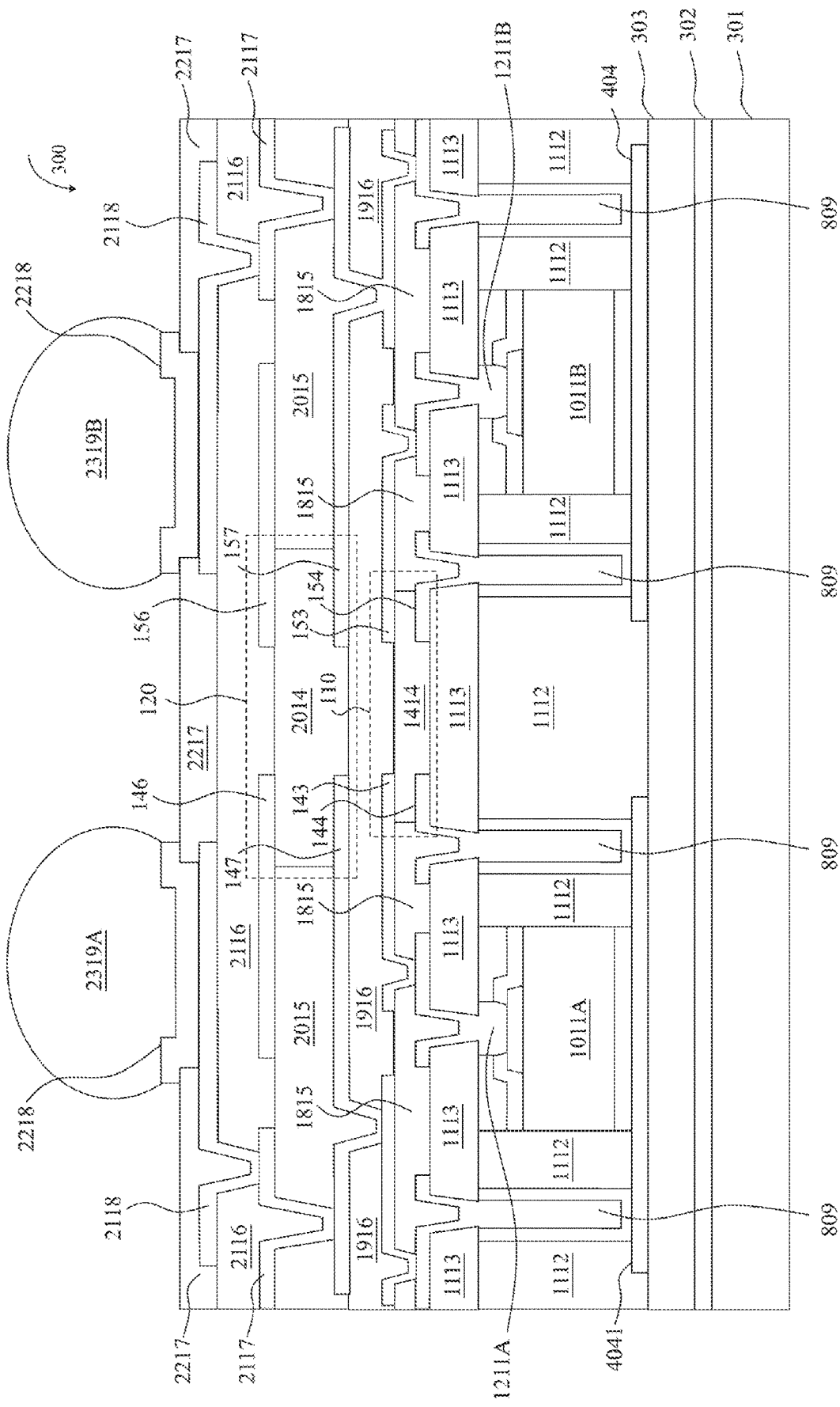

External connectors 2319A and 2319B, which are configured to be input/output (I/O) pads, including, for example, solder balls on the UBMs 2218 are then formed as illustrated in the embodiment shown in FIG. 23.

In some embodiments, the connectors 2319A and 2319B are ball grid array (BGA) balls, controlled collapse chip connector bumps, and the like disposed on the UBMs 2218, which are formed over the RDLs 2118. In some embodiments, the connectors 2319A and 2319B are used to electrically connect the package 300 to other package components including, for example, another device die, interposers, package substrates, printed circuit boards, a mother board, and the like. In some embodiments, the connector 2319A is coupled to a transmitter ground such as the transmitter ground GT shown in FIG. 1A, and the connector 2319B is coupled to a receiver ground such as the receiver ground RT shown in FIG. 1A. Thus, the transmitter electrodes 144 and 147 are coupled to the transmitter ground via the conductive vias 809, the RDLs 404, 2117 and 2118, and the connector 2319A. The receiver electrodes 154 and 157 are coupled to the receiver ground via the conductive vias 809, the RDLs 404, 2117 and 2118, and the connector 2319B.

Figure 24:
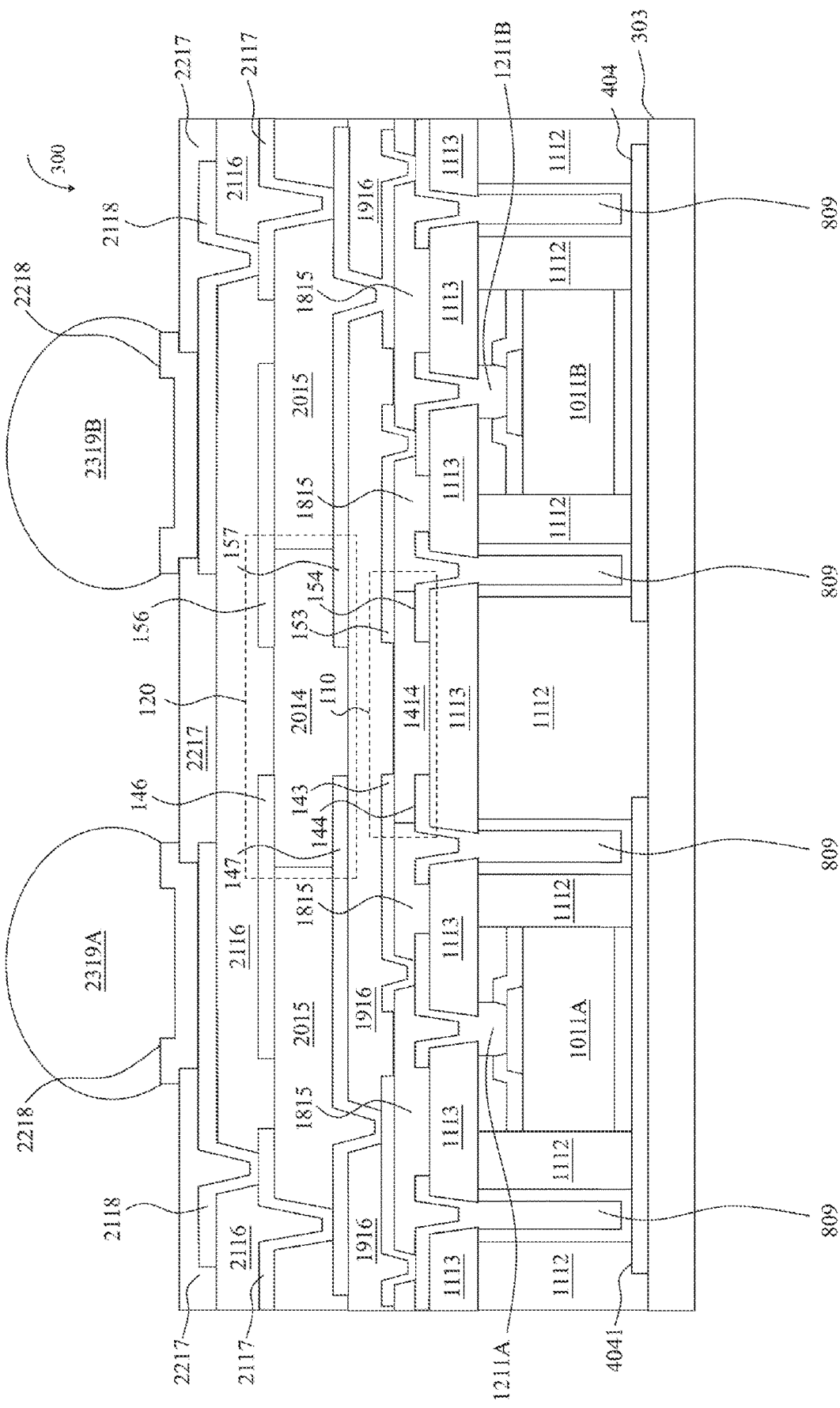

Next, the carrier 301 and the adhesive layer 302 are removed from the package 300. The resulting structure is shown in FIG. 24. In some embodiments, the polymer base layer 303 is left in the resulting package 300 as an insulating and protective layer.

The above illustrations include exemplary operations, but the operations are not necessarily performed in the order shown. Operations may be added, replaced, changed order, and/or eliminated as appropriate, in accordance with the spirit and scope of various embodiments of the present disclosure.

Figure 25:
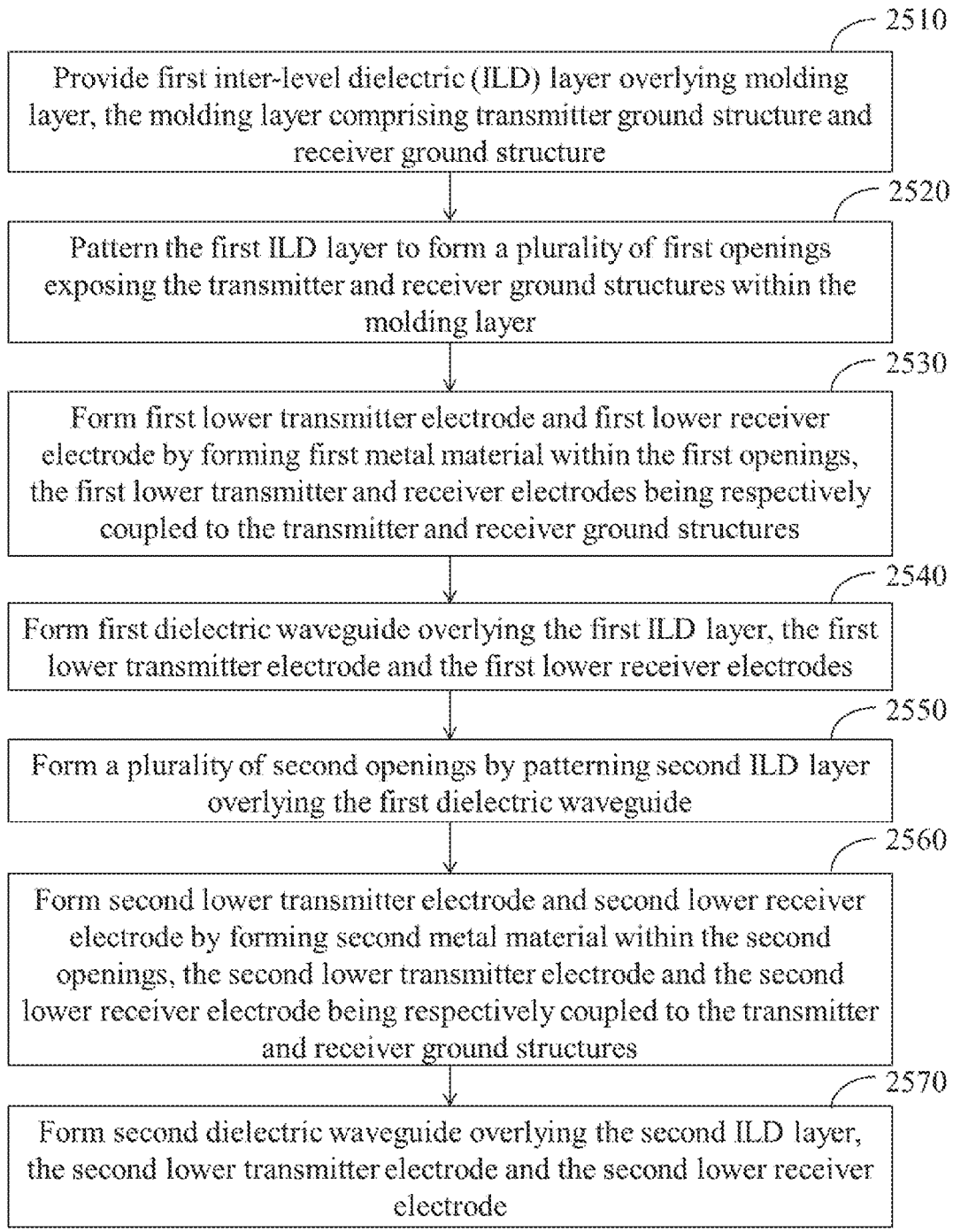
FIG. 25 is a flow chart of an exemplary method for forming a semiconductor structure in accordance with some embodiments of the present disclosure.

FIG. 25 is a flow chart of an exemplary method for forming a semiconductor structure in accordance with some embodiments of the present disclosure. For illustration purposes, the exemplary method shown in FIG. 25 is discussed in relation to the semiconductor structure included in the package 300 described above in FIGS. 3-24, but is not limited thereto. In addition, while disclosed methods are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At operation 2510, a first inter-level dielectric (ILD) layer overlying a molding layer is provided. A transmitter ground structure and a receiver ground structure is included within the molding layer. For example, in the embodiment shown in FIG. 13, the polymer layer 1113, i.e. an ILD layer, overlying the molding layer 1112 is provided. The molding layer 1112 encompassing a transmitter ground structure and a receiver ground structure. The transmitter ground structure includes the conductive vias 809 and the backside RDL 404 around the transmitter die 1011A, and the receiver ground structure includes the conductive vias 809 and the backside RDL 404 around the receiver die 1011B.

At operation 2520, the first ILD layer is patterned to form a plurality of first openings exposing the transmitter ground structure and the receiver ground structure within the molding layer. For example, in the embodiment illustrated in FIG. 13, the polymer layer 1113 overlying the molding layer 1112 is patterned to form a plurality of openings exposing the transmitter ground structure and the receiver ground structure within the molding layer 1112.

At operation 2530, a first lower transmitter electrode and a first lower receiver electrode are formed by forming a first metal material within the plurality of first openings, wherein the first lower transmitter electrode and the first lower receiver electrode are respectively coupled to the transmitter ground structure and the receiver ground structure. For example, in the embodiment in FIG. 13, the transmitter electrode 144 and the receiver electrode 154, e.g. a lower transmitter electrode and a lower receiver electrode, are provided by forming a metal material within the openings exposing the conductive vias 809.

At operation 2540, a first dielectric waveguide overlying the first ILD layer, the first lower transmitter electrode and the first lower receiver electrode are formed. For example, in the embodiments shown in FIGS. 14-18, the waveguide dielectric material 1414, which overlies the polymer layer 1113, the transmitter electrode 144 and the receiver electrode 154, is patterned to form the first dielectric waveguide 110.

At operation 2550, a plurality of second openings is formed by patterning a second ILD layer overlying the first dielectric waveguide. For example, in the embodiment shown in FIG. 19, the polymer layer 1916, e.g. an ILD layer, overlying the first dielectric waveguide 110 is patterned to form a plurality of openings.

At operation 2560, a second lower transmitter electrode and a second lower receiver electrode are formed by forming a second metal material within the plurality of second openings, wherein the second lower transmitter electrode and the second lower receiver electrode are respectively coupled to the transmitter ground structure and the receiver ground structure. For example, in the embodiment shown in FIG. 19, the transmitter electrode 147 and the receiver electrode 157, e.g. a lower transmitter electrode and a lower receiver electrode, are provided by forming a metal material within the openings which are connected to the conductive vias 809 through the conductive material in the polymer layer 1815.

At operation 2570, a second dielectric waveguide overlying the second ILD layer, the second lower transmitter electrode and the second lower receiver electrode are formed. For example, in the embodiment shown in FIGS. 20 and 21, the waveguide dielectric material 2014, which overlies the polymer layer 1916, the transmitter electrode 147 and the receiver electrode 157, is patterned to form the second dielectric waveguide 120.

In some embodiments, an electromagnetic signal guided by the first dielectric waveguide is different in frequency from an electromagnetic signal guided by the second dielectric waveguide. For example, in the embodiments shown in FIGS. 21-24, an electromagnetic signal guided by the first dielectric waveguide 110 is different in frequency from an electromagnetic signal guided by the second dielectric waveguide 120. In some embodiments, a dielectric constant of the waveguide dielectric material 1414 is different from a dielectric constant of the waveguide dielectric material 2014, and/or a thickness of the waveguide dielectric material 1414 is different from a thickness of the waveguide dielectric material 2014.

In some embodiments, a first upper transmitter electrode is formed to be located along an upper side of the first dielectric waveguide, and/or a second upper transmitter electrode is formed to be located along an upper side of the second dielectric waveguide, wherein each of the first upper transmitter electrode and the second upper transmitter electrode is coupled to a transmitter circuit within the molding layer. For example, as described in FIG. 18 and FIG. 21, the transmitter electrode 143 is formed overlying the waveguide dielectric material 1414, and the transmitter electrode 146 is formed overlying the waveguide dielectric material 2014. Each of the transmitter electrode 143 and the transmitter electrode 146 is coupled to the transmitter die 1011A that includes, for example, the transmitter circuit 140 shown in FIG. 1A, within the molding layer 1112.

In some embodiments, a first upper receiver electrode is formed to be located along an upper side of the first dielectric waveguide, and/or a second upper receiver electrode is formed to be located along an upper side of the second dielectric waveguide, wherein each of the first upper receiver electrode and the second upper receiver electrode is coupled to a receiver circuit within the molding layer. For example, as described in FIG. 18 and FIG. 21, the receiver electrode 154 is formed overlying the waveguide dielectric material 1414, and the receiver electrode 157 is formed overlying the waveguide dielectric material 2014, wherein each of the receiver electrode 154 and the receiver electrode 157 is coupled to the receiver die 1011B that includes, for example the receiver circuit 150 shown in FIG. 1A, within the molding layer 1112.

Some embodiments described herein may include a semiconductor structure that includes a first dielectric waveguide, a second dielectric waveguide, a first inter-level dielectric (ILD) material, a first transmitter coupling structure and a second transmitter coupling structure. The first dielectric waveguide and the second dielectric waveguide are disposed one over the other. The first dielectric waveguide is configured to guide a first electromagnetic signal from a first transmission end portion to a first receiver end portion of the first dielectric waveguide, and the second dielectric waveguide is configured to guide a second electromagnetic signal from a second transmission end portion to a second receiver end portion of the second dielectric waveguide. The second electromagnetic signal is different in frequency from the first electromagnetic signal. The first ILD material is disposed between the first dielectric waveguide and the second dielectric waveguide. The first transmitter coupling structure is configured to couple a first driver signal generated by a transmitter circuit to the first transmission end portion and accordingly produce the first electromagnetic signal. The second transmitter coupling structure is configured to couple a second driver signal generated by the transmitter circuit to the second transmission end portion and accordingly produce the second electromagnetic signal.

Some embodiments described herein may include a semiconductor structure that includes N dielectric waveguides, N first metal layers and N second metal layers. N is an integer greater than one. The N dielectric waveguides are disposed one above another and spatially separated from each other. Each of the N dielectric waveguides has a rectangular cross-section, a first side and a second side opposite to the first side. An electromagnetic signal guided by a first dielectric waveguide of the N dielectric waveguides is different in frequency from an electromagnetic signal guided by a second dielectric waveguide of the N dielectric waveguides. The N first metal layers are disposed along respective first sides of the N dielectric waveguides respectively. The N second metal layers are disposed along respective second sides of the N dielectric waveguides respectively.

Some embodiments described herein may include a method for forming a semiconductor structure. The method includes providing a first inter-level dielectric (ILD) layer overlying a molding layer, the molding layer comprising a transmitter ground structure and a receiver ground structure; patterning the first ILD layer to form a plurality of first openings exposing the transmitter ground structure and the receiver ground structure within the molding layer; forming a first lower transmitter electrode and a first lower receiver electrode by forming a first metal material within the plurality of first openings, the first lower transmitter electrode and the first lower receiver electrode being respectively coupled to the transmitter ground structure and the receiver ground structure; forming a first dielectric waveguide overlying the first ILD layer, the first lower transmitter electrode and the first lower receiver electrode; forming a plurality of second openings by patterning a second ILD layer overlying the first dielectric waveguide; forming a second lower transmitter electrode and a second lower receiver electrode by forming a second metal material within the plurality of second openings, the second lower transmitter electrode and the second lower receiver electrode being respectively coupled to the transmitter ground structure and the receiver ground structure; and forming a second dielectric waveguide overlying the second ILD layer, the second lower transmitter electrode and the second lower receiver electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a base layer;
a first dielectric waveguide disposed over the base layer;
a second dielectric waveguide disposed over the first dielectric waveguide, one of the first dielectric waveguide and the second dielectric waveguide being disposed over a top of the other of the first dielectric waveguide and the second dielectric waveguide, the first dielectric waveguide configured to guide a first electromagnetic signal from a first transmission end portion to a first receiver end portion of the first dielectric waveguide, the second dielectric waveguide configured to guide a second electromagnetic signal from a second transmission end portion to a second receiver end portion of the second dielectric waveguide, the second electromagnetic signal being different in frequency from the first electromagnetic signal;
a first inter-level dielectric (ILD) material disposed between the base layer and the first dielectric waveguide and between the first dielectric waveguide and the second dielectric waveguide;
a first transmitter coupling structure configured to couple a first driver signal generated by a transmitter circuit to the first transmission end portion and accordingly produce the first electromagnetic signal; and
a second transmitter coupling structure configured to couple a second driver signal generated by the transmitter circuit to the second transmission end portion and accordingly produce the second electromagnetic signal,
wherein the first dielectric waveguide has a first thickness, measured in a direction perpendicular to an upper surface of the base layer, associated with the first electromagnetic signal, wherein the second dielectric waveguide has a second thickness, measured in the direction, associated with the second electromagnetic signal, and wherein the first thickness is different from the second thickness.

2. The semiconductor structure of claim 1, wherein the second dielectric waveguide is disposed over the first ILD material, and the first ILD material is disposed over the first dielectric waveguide, wherein the frequency of the first electromagnetic signal is greater than the frequency of the second electromagnetic signal.

3. The semiconductor structure of claim 1, wherein the second dielectric waveguide is disposed over the first ILD material, and the first ILD material is disposed over the first dielectric waveguide, wherein a dielectric constant of the first dielectric waveguide is greater than a dielectric constant of the second dielectric waveguide.

4. The semiconductor structure of claim 1, wherein the second dielectric waveguide is disposed over the first ILD material, and the first ILD material is disposed over the first dielectric waveguide wherein the first thickness of the first dielectric waveguide is smaller than the second thickness of the second dielectric waveguide.

5. The semiconductor structure of claim 1, wherein a dielectric constant of the first ILD material is smaller than a dielectric constant of the first dielectric waveguide and a dielectric constant of the second dielectric waveguide.

6. The semiconductor structure of claim 1, further comprising a second ILD material, the first dielectric waveguide being disposed between the first ILD material and the second ILD material, a dielectric constant of the first dielectric waveguide being greater than a dielectric constant of the first ILD material and a dielectric constant of the second ILD material.

7. The semiconductor structure of claim 1, wherein the first transmitter coupling structure comprises:
a first transmitter electrode comprising a first metal structure disposed over the first dielectric waveguide, the first metal structure configured to couple the first driver signal to the first transmission end portion; and
a second transmitter electrode comprising a second metal structure disposed below the first dielectric waveguide, the second metal structure coupled between the first transmission end portion and a ground terminal.

8. The semiconductor structure of claim 1, further comprising:
a first receiver coupling structure coupled to the first receiver end portion, and configured to couple the first electromagnetic signal to produce a first receiver signal comprising data carried by the first driver signal; and
a second receiver coupling structure coupled to the second receiver end portion, and configured to couple the second electromagnetic signal to produce a second receiver signal comprising data carried by the second driver signal.

9. The semiconductor structure of claim 8, wherein the first receiver coupling structure comprises:
a first receiver electrode comprising a first metal structure disposed over the first dielectric waveguide, the first metal structure configured to couple the first receiver end portion to a receiver circuit; and
a second receiver electrode comprising a second metal structure disposed below the first dielectric waveguide, the second metal structure coupled between the first receiver end portion and a ground terminal.

10. The semiconductor structure of claim 1, wherein the first dielectric waveguide comprises at least one of $PbZrTiO_3$, $BaSrTiO_3$ and $BaTiO_3$, and the second dielectric waveguide comprises at least one of $SiO_2$, $SiN_X$, $Al_2O_3$, $Y_2O_3$, $TiO_2$, $HfO_X$, $ZrO_2$, $HfSiO_X$, $ZrTiO_X$, $TaO_X$ and $SrTiO_3$.

11. A semiconductor structure, comprising:
a base layer;
N dielectric waveguides disposed over one another above the base layer and spatially separated from each other, one of the N dielectric waveguides being disposed over a top of another of the N dielectric waveguides, each of the N dielectric waveguides having a rectangular cross-section, a first side and a second side opposite to the first side, an electromagnetic signal guided by a first dielectric waveguide of the N dielectric waveguides being different in frequency from an electromagnetic signal guided by a second dielectric waveguide of the N dielectric waveguides, N being an integer greater than one;
N first metal layers disposed along respective first sides of the N dielectric waveguides respectively; and
N second metal layers disposed along respective second sides of the N dielectric waveguides respectively,
wherein the first dielectric waveguide has a first lower surface facing the base layer and a first upper surface opposite the first lower surface, the second dielectric waveguide has a second lower surface facing the first upper surface and a second upper surface opposite the second lower surface, and wherein a first thickness defined as a distance between the first upper surface and the first lower surface is different from a second thickness defined as a distance between the second upper surface and the second lower surface.

12. The semiconductor structure of claim 11, wherein a dielectric constant of the first dielectric waveguide is different from a dielectric constant of the second dielectric waveguide.

13. The semiconductor structure of claim 11, wherein the first dielectric waveguide comprises a first sidewall aligned with a second sidewall of the second dielectric waveguide.

14. The semiconductor structure of claim 11, wherein each of the N first metal layers comprises a first transmitter electrode and a first receiver electrode separated from each other, the first transmitter electrode is coupled to a transmitter circuit, and the first receiver electrode is coupled to a receiver circuit, wherein each of the N second metal layers comprises a second transmitter electrode and a second receiver electrode separated from each other, the second transmitter electrode is coupled to a transmitter ground, and the second receiver electrode is coupled to a receiver ground.

15. The semiconductor structure of claim 14, further comprising:
a molding compound disposed below the N dielectric waveguides, the molding compound arranged to surround the transmitter circuit and the receiver circuit.

16. The semiconductor structure of claim 11, further comprising:
a plurality of inter-level dielectric (ILD) layers interleaved with the N dielectric waveguides, a dielectric constant of each dielectric waveguide being greater than a dielectric constant of an ILD layer located on the respective first sides of the N dielectric waveguides and a dielectric constant of an ILD layer located on the respective second sides of the N dielectric waveguides.

17. A semiconductor structure, comprising:
a base layer;
a first dielectric waveguide disposed over the base layer;
a second dielectric waveguide disposed over the first dielectric waveguide, one of the first dielectric waveguide and the second dielectric waveguide being disposed over a top of the other of the first dielectric waveguide and the second dielectric waveguide, the first dielectric waveguide configured to guide a first electromagnetic signal from a first transmission end portion to a first receiver end portion of the first dielectric waveguide, the second dielectric waveguide configured to guide a second electromagnetic signal from a second transmission end portion to a second receiver end portion of the second dielectric waveguide, the second electromagnetic signal being different in frequency from the first electromagnetic signal;
a first inter-level dielectric (ILD) material disposed between the first dielectric waveguide and the second dielectric waveguide;
a first receiver coupling structure, coupled between the first receiver end portion and a receiver circuit, the first receiver coupling structure configured to couple the first electromagnetic signal out of the first dielectric waveguide and accordingly produce a first receiver signal received by the receiver circuit; and
a second receiver coupling structure, coupled between the second receiver end portion and the receiver circuit, the second receiver coupling structure configured to couple the second electromagnetic signal out of the second dielectric waveguide and accordingly produce a second receiver signal received by the receiver circuit,
wherein the first ILD material comprises a first surface facing the first dielectric waveguide and in contact with a first receiver electrode of the first receiver coupling structure, and comprises a second surface opposite the first surface and in contact with a second receiver electrode of the second receiver coupling structure.

18. The semiconductor structure of claim 17, wherein a dielectric constant of the first ILD material is smaller than a dielectric constant of the first dielectric waveguide and a dielectric constant of the second dielectric waveguide.

19. The semiconductor structure of claim 17, further comprising a second ILD material, the first dielectric waveguide being disposed between the first ILD material and the second ILD material, a dielectric constant of the first dielectric waveguide being greater than a dielectric constant of the first ILD material and a dielectric constant of the second ILD material.

20. The semiconductor structure of claim 17, wherein:
the first receiver electrode comprises a first metal structure disposed over the first dielectric waveguide, the first metal structure configured to couple the first receiver end portion to the receiver circuit; and
the second receiver electrode comprises a second metal structure disposed below the first dielectric waveguide, the second metal structure coupled between the first receiver end portion and a ground terminal.

* * * * *